(12) United States Patent
Kajiwara et al.

(10) Patent No.: US 9,030,656 B2
(45) Date of Patent: May 12, 2015

(54) INSPECTION DEVICE, INSPECTION METHOD AND NON-TRANSITORY STORAGE MEDIUM FOR INSPECTING DEFORMATION OF SUBSTRATE HOLDING MEMBER, AND SUBSTRATE PROCESSING SYSTEM INCLUDING THE INSPECTION DEVICE

(75) Inventors: Hideki Kajiwara, Koshi (JP); Junnosuke Maki, Koshi (JP); Suguru Enokida, Koshi (JP)

(73) Assignee: Tokyo Electron Limited, Minato-Ku (JP)

( * ) Notice: Subject to any disclaimer, the term of this patent is extended or adjusted under 35 U.S.C. 154(b) by 635 days.

(21) Appl. No.: 13/278,496

(22) Filed: Oct. 21, 2011

(65) Prior Publication Data
US 2012/0099951 A1   Apr. 26, 2012

(30) Foreign Application Priority Data
Oct. 22, 2010   (JP) ................... 2010-237843

(51) Int. Cl.
*G01N 21/00*    (2006.01)
*G01B 11/02*    (2006.01)
*G01B 11/08*    (2006.01)
*H01L 21/67*    (2006.01)
*H01L 21/677*   (2006.01)

(52) U.S. Cl.
CPC .... *H01L 21/67265* (2013.01); *H01L 21/67742* (2013.01)

(58) Field of Classification Search
CPC ... G05D 3/125; B65G 49/00; G01N 35/1011; G01N 21/0106–21/0193; H01L 21/00; H01L 22/10; G01B 11/14; G01B 11/16
See application file for complete search history.

(56) References Cited

U.S. PATENT DOCUMENTS

| 5,105,147 | A  | * | 4/1992  | Karasikov et al. ............. 324/537 |
| 5,155,371 | A  | * | 10/1992 | Burggraf et al. ......... 250/559.18 |
| 6,380,503 | B1 | * | 4/2002  | Mills et al. .................... 209/586 |
| 7,738,091 | B2 | * | 6/2010  | Tsuji .......................... 356/237.4 |
| 2008/0232937 | A1 |  | 9/2008  | Abe et al. |
| 2012/0046904 | A1 | * | 2/2012  | Hayashi et al. ............... 702/150 |

FOREIGN PATENT DOCUMENTS

JP    2008-235841 A1    10/2008

* cited by examiner

*Primary Examiner* — Kara E Geisel
*Assistant Examiner* — Hina F Ayub
(74) *Attorney, Agent, or Firm* — Burr & Brown, PLLC

(57) ABSTRACT

Disclosed is an inspection device for inspecting deformation of a substrate holding member of a substrate transport apparatus. The substrate holding member is moved in the forward-and-backward direction relative to the transport base to pass across a light path of the detection light formed by an optical detection unit. The position, with respect to a direction transverse to the forward-and-backward direction, of the substrate holding member is detected based on a detection signal of the optical detection unit. Based on a correlation data expressing the relationship between a first parameter indicative of a change of a position of the substrate holding member with respect to the forward-and-backward direction and a second parameter indicative of the change of the position of the substrate holding member with respect to the direction transverse to the forward-and-backward direction, whether or not deformation occurs in the substrate holding member is judged.

20 Claims, 21 Drawing Sheets

INSPECTION DEVICE, INSPECTION METHOD AND NON-TRANSITORY STORAGE MEDIUM FOR INSPECTING DEFORMATION OF SUBSTRATE HOLDING MEMBER, AND SUBSTRATE PROCESSING SYSTEM INCLUDING THE INSPECTION DEVICE

CROSS-REFERENCE TO RELATED APPLICATIONS

The present application is based on and claims the benefit of priority to Japanese Patent Application No. 2010-237843 filed on Oct. 22, 2010, the entire contents of which are incorporated herein by reference.

BACKGROUND OF THE INVENTION

1. Field of the Invention

The disclosure relates to a technique for inspecting deformation of a substrate holding member which is configured to hold a substrate to transport the same, and which is mounted on a transport base of a substrate transport apparatus and is movable in a forward-and-backward direction relative to the transport base.

2. Description of Related Art

In manufacturing of semiconductor devices or liquid crystal displays, a substrate processing system having plural processing modules is used. Substrates (e.g., semiconductor wafers) are transferred between the processing modules by using a substrate transport apparatus installed in the substrate processing apparatus, and the substrates are subjected to predetermined processes in the processing modules. The substrate transport apparatus has a transport base and forks (wafer holding members) each for holding the periphery of a wafer which are mounted to the transport base and are movable in a forward-and-backward direction relative to the transport base. The transport base is rotatable about a vertical axis and is vertically movable.

In the substrate processing system, a specific transfer position is set at which a wafer is transferred from the substrate transport apparatus to a processing module and vice versa. The fork of the substrate transport apparatus is moved to the transfer position, and the wafer is transferred between the fork and the processing module. If the transfer position is set inappropriately, the fork may collide with any structural member of the processing module. In a case where the fork receives a wafer from a processing module holding the wafer in an inappropriate position, or in a case where a wafer slips on the fork due to a liquid adhering to the wafer, the wafer may be held on the fork at an inappropriate position. In such cases, the wafer may collide with any structural member of the processing module. If the aforementioned collision occurs, the fork may become deformed such that the fork bends upward or downward, or the open ends of the fork are narrowed or widened. Continuous operation of the deformed fork may result in a secondary accident, such as falling of the wafer from the fork, and further collision of the fork with any structural member, which may break the wafer, the fork or the substrate transport apparatus.

In order to avoid such a secondary accident, if the fork collides with any structural member to trigger an alarm, the operator enters the interior space of the substrate processing system, and conducts visual inspection for the deformation of the fork according to the inspection manual, and conducts maintenance (repair) if the fork is deformed. It is difficult to determine the condition of the fork precisely, because the interior space of the substrate processing system is narrow and darkish. In addition, due to a large numbers of items to be inspected, the operator bears a heavy burden. The preciseness of the visual inspection depends on the operator's skill, and thus quantitative judgment of the fork deformation is difficult.

US2008/0232937A1 (JP2008-235841A) discloses a substrate transport apparatus having a transport base and horizontally-extending holding arms, and having an inspection device for inspecting whether or not the posture of the holding arms with respect to the horizontal plane is normal. The inspection device has an optical sensor forming a horizontal light path. The transport base moves vertically so that the holding arms, moves across the light path, and based on the detection signal of the optical sensor indicating "light reception"/"no light reception" and the height of the transport base, whether or not the posture of each holding arms is normal is judged.

The inspection method taught by US2008/0232937A1 is advantageous for judging whether or not the posture of vertically-arrayed holding arms is normal can be judged at one time, but can hardly judge whether or not local deformation occurs in the holding arms.

SUMMARY OF THE INVENTION

The present disclosure provides a technique for detecting the deformation of the substrate holding member easily and certainly.

In one embodiment, there is provided an inspection device for inspecting deformation of a substrate holding member of a substrate transport apparatus, the substrate transport apparatus having a transport base and a drive unit for horizontally moving the substrate holding member in a forward-and-backward direction relative to the transport base, the inspection device including: an optical detection unit having a light emitter and a light receiver, the optical detection unit being configured to emit by the light emitter a detection light to the substrate holding member, configured to receive by the light receiver the detection light affected by the substrate holding member thereby to output a detection signal that varies depending on a change of a position of the substrate holding member with respect to a direction transverse to the forward-and-backward direction, the optical detection unit being disposed at a location that allows the substrate holding member to pass across a light path of the detection light emitted from the light emitter by moving the substrate holding member in the forward-and-backward direction; and a data acquiring unit configured to acquire a correlation data based on the detection signal obtained when the substrate holding member is moving in the forward-and-backward direction to pass across the light path of the detection light emitted from the light emitter, the correlation data expressing a relationship between a first parameter indicative of a change of a position of the substrate holding member with respect to the forward-and-backward direction and a second parameter indicative of the change of the position of the substrate holding member with respect to the direction transverse to the forward-and-backward direction, whereby whether or not deformation occurs in the substrate holding member can be judged based on the correlation data.

The "first parameter indicative of a change of a position of the substrate holding member with respect to the forward-and-backward direction" may be an elapsed time if the substrate holding member is moving at a constant velocity at least it is passing across the detection light path. Alternatively, the first parameter may be actual displacement of the substrate holding member detected by a suitable detecting device such as an encoder of the drive unit.

In one variation of the embodiment, the optical detection unit may be provided to detect a vertical position of the substrate holding member, and thus the data acquiring unit is configured to acquire a correlation data a relationship between the first parameter, and the Second parameter indicative of the change of the vertical position of the substrate holding member; and the inspection device may further include a judgment unit configured to calculate a value of a second order derivative of a function, which expresses vertical position of the substrate holding member as the function of the first parameter, and configured to judge whether or not deformation occurs in the substrate holding member based on the calculated value of a second order derivative.

In another variation, the optical detection unit may be configured to form the light path of the detection light extending in a right-and-left direction and having a vertical width, and may be configured to detect the vertical position of the substrate holding member based on an amount of the detection light interrupted by the substrate holding member passing across the light path.

In yet another variation, the inspection device may further includes a data display unit configured to make a graph expressing the relationship between the first parameter and the second parameter based on the correlation data, and display the graph.

In yet another variation, the substrate holding member to be inspected may have a bifurcated frame having distal ends configured to surround a periphery of a substrate when the substrate holding member holds the substrate; and the optical detection unit may be provided to detect the position of the substrate holding member with respect to a right-and-left direction, and thus the data acquiring unit may be configured to acquire a correlation data a relationship between the first parameter, and the second parameter indicative of the change of the position of the substrate holding member with respect to the right-and-left direction, whereby whether or not deformation relating to a change of an opening degree of the distal ends occurs in the bifurcated frame of the substrate holding member can be judged based on the correlation data.

In yet another variation, the optical detection unit may be configured to form the light path of the detection light extending in a vertical direction and having a width with respect to the right-and-left direction, and may be configured to detect the position of the substrate holding member with respect to the right-and-left direction based on an amount of the detection light interrupted by the substrate holding member passing across the light path.

In another embodiment, there is provided a substrate processing apparatus including: a substrate processing unit configured to perform a treatment to a substrate; a substrate transport apparatus configured to transfer a substrate to and from the substrate processing unit, the substrate transport apparatus having a transport base, a substrate holding member for holding a substrate, and a drive unit for horizontally moving the substrate holding member in a forward-and-backward direction relative to the transport base; and the aforementioned inspection device.

In yet another embodiment, there is provided an inspection method for inspecting deformation of a substrate holding member of a substrate transport apparatus, the substrate transport apparatus having a transport base and a drive unit for horizontally moving the substrate holding member in a forward-and-backward direction relative to the transport base, the inspection method including: moving the substrate holding member in the forward-and-backward direction relative to the transport base to pass across a light path of the detection light formed by an optical detection unit; detecting a position, with respect to a direction transverse to the forward-and-backward direction, of the substrate holding member based on a detection signal of the optical detection unit; making a correlation data expressing a relationship between a first parameter indicative of a change of a position of the substrate holding member with respect to the forward-and-backward direction and a second parameter indicative of the change of the position of the substrate holding member with respect to the direction transverse to the forward-and-backward direction; judging whether or not deformation occurs in the substrate holding member based on the correlation data.

In yet another embodiment, there is provided a non-transitory storage medium storing a computer program, wherein upon execution of the program by a computer, the computer controls a substrate transport apparatus having a substrate holding member for holding a substrate, a transport base and a drive unit for horizontally moving the substrate holding member in a forward-and-backward direction relative to the base member, and the control computer also controls a substrate inspection device having an optical detection unit, to perform the aforementioned inspection method.

DETAILED DESCRIPTION OF THE INVENTION

Figure 1:
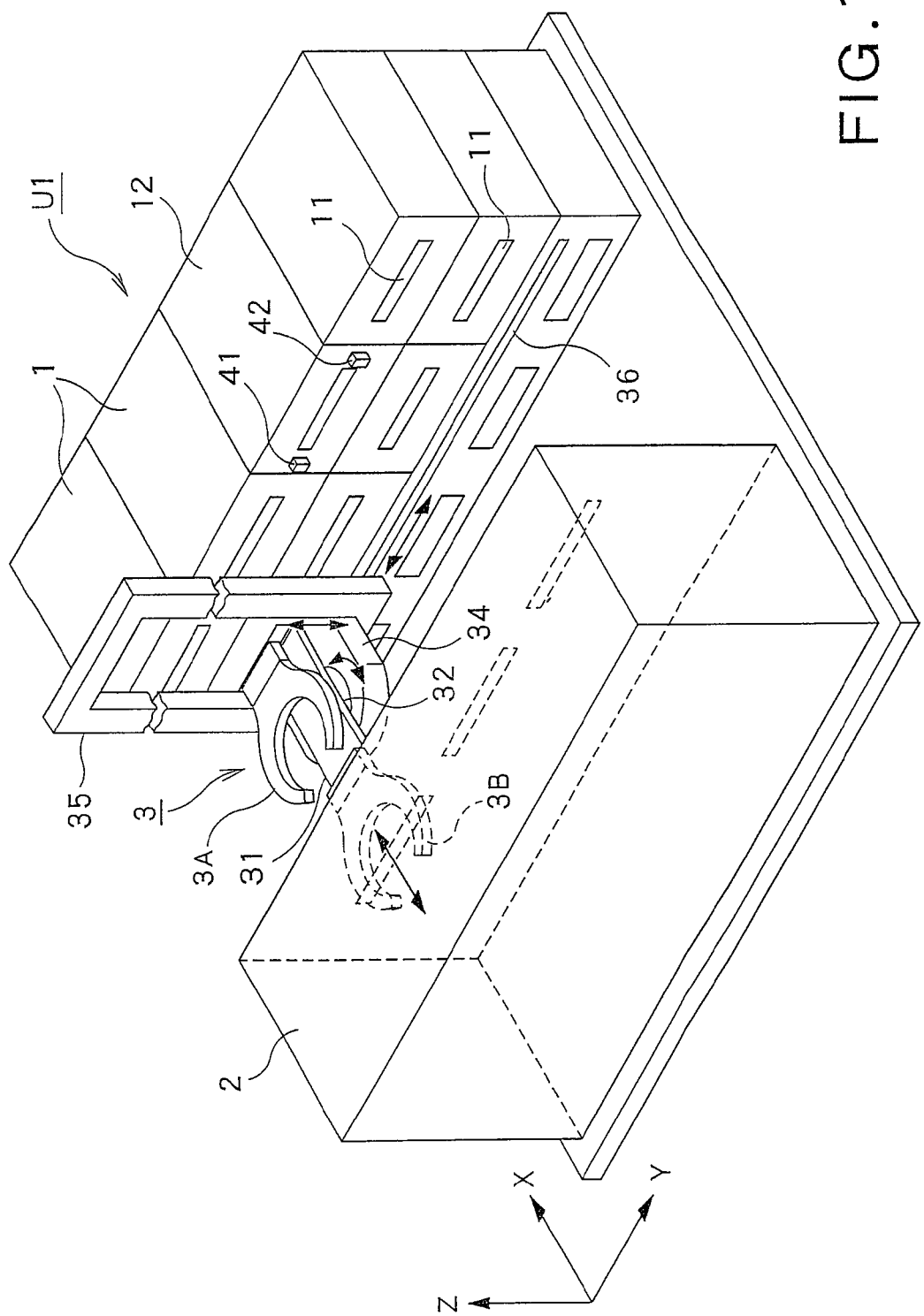
FIG. 1 is schematic perspective view of a substrate processing system in one example.

A first embodiment of deformation inspection device for inspecting deformation of a substrate holding member will be described below. The overall structure of a substrate processing system including the deformation inspection device is briefly described at first. FIG. 1 shows a structure of a processing block of the substrate, processing system. The processing block is provided with a shelf unit U1 including plural processing modules 1 each configured to process a substrate, and a substrate processing unit 2 opposing the shelf unit U1. A transport arm 3, namely a substrate transport apparatus, is provided to transport a wafer W, which is a substrate, between the processing modules 1 of the shelf unit U1 and the substrate processing unit 2.

The shelf unit U1 is structured by stacking the plural processing modules 1, such as a heating module and a cooling module. The substrate processing unit 2 is configured to perform a process for coating a wafer W with a resist liquid, or a process for supplying a developing liquid with the wafer W. The reference number 11 in FIG. 1 depicts a loading/unloading port through which the wafer W is transported to each of the processing modules 1 from the transport arm 3.

Figure 2:
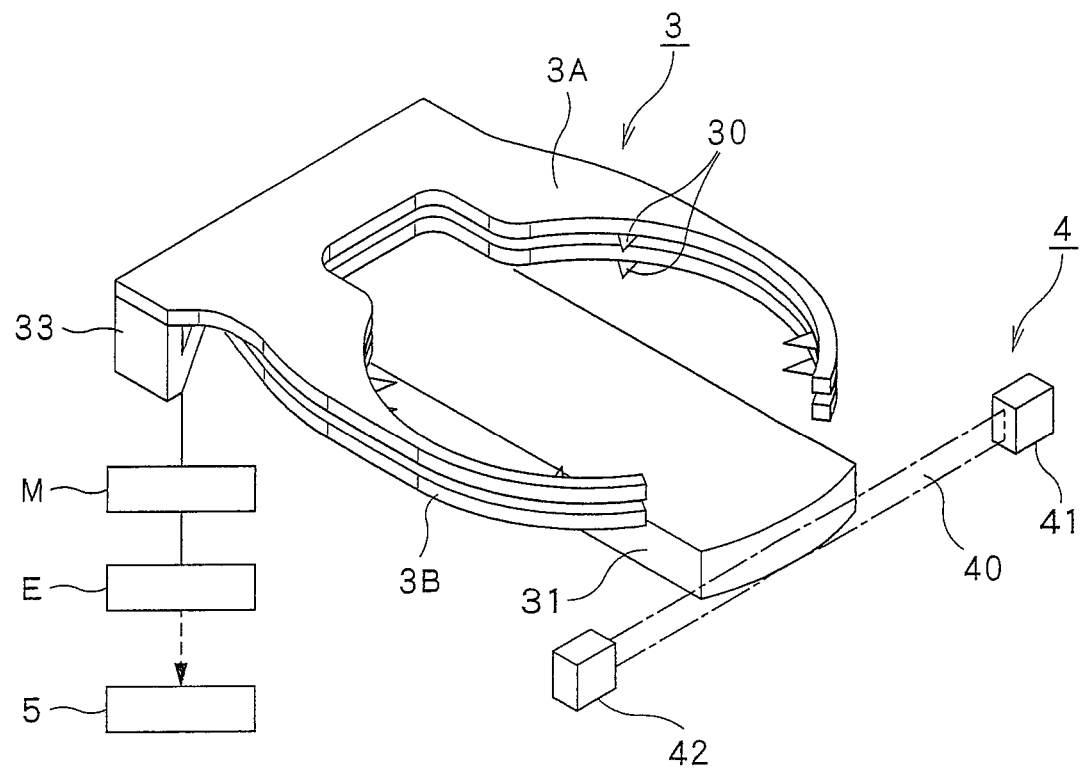
FIG. 2 is schematic perspective view of a substrate transport apparatus and an optical detection unit in a first embodiment.
Figure 3:
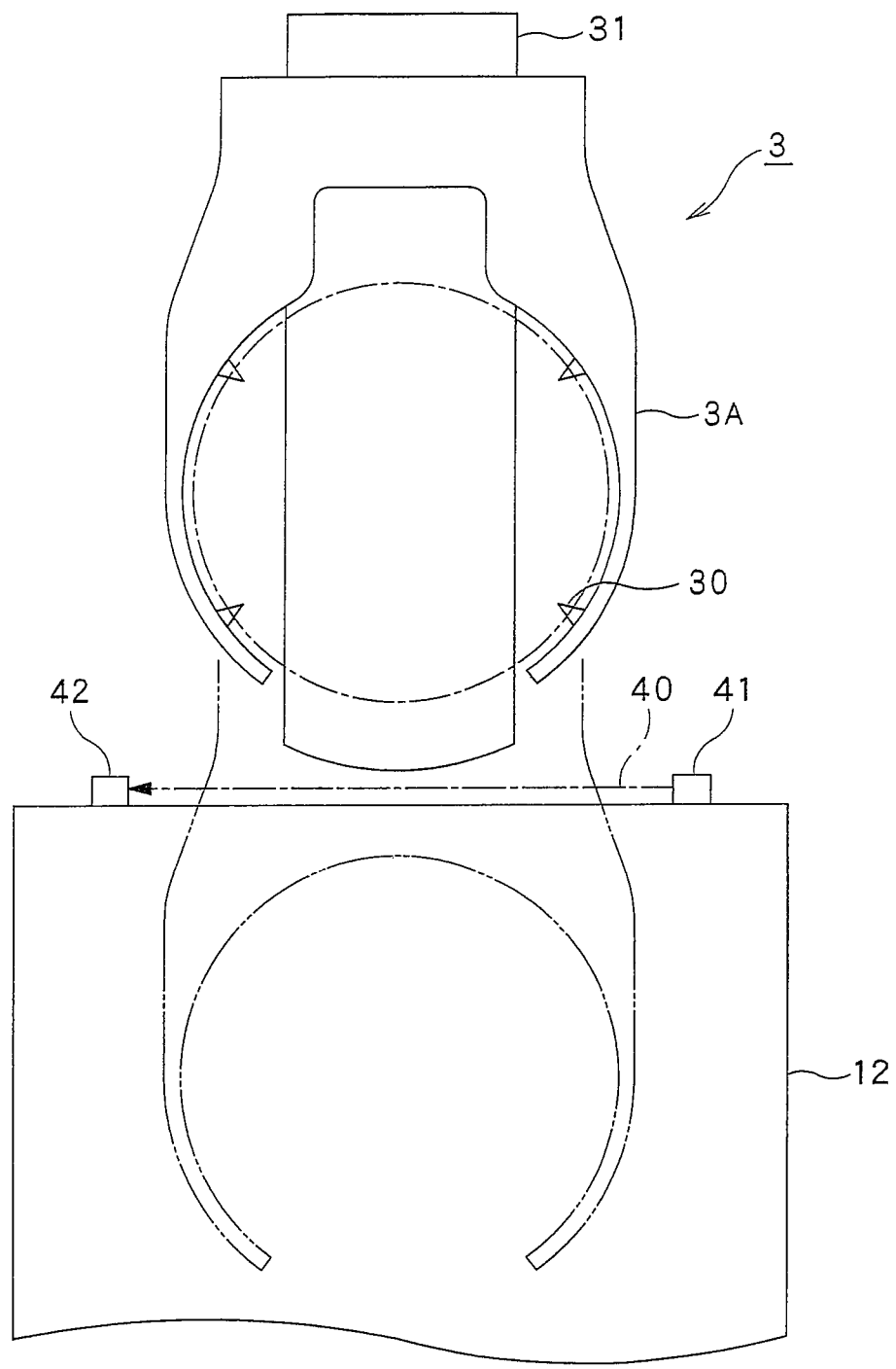
FIG. 3 is a top plan view of the substrate transport apparatus and the optical detection unit.

As shown in FIGS. 1 to 3, the transport arm 3 has a transport base 31, and plural forks, e.g., two forks 3 (3A, 3B) as substrate holder frames which are disposed so as to be movable in a forward and backward direction (in X-axis direction in. FIG. 1) relative, to the transport base 31. The transport base 31 is rotatable about a vertical axis by a rotary mechanism 32. Disposed on a proximal side of the fork 3A (3A, 3B) is a forward and backward driving unit 33 (33A, 33B) that is configured to move the fork 3 in the forward and backward direction relative to the transport base 31. Although the detailed illustration is omitted, the forward and backward driving unit 33 is composed of a driving mechanism (not shown) using a timing belt (not shown) disposed inside the transport base 31. An encoder E is connected to an electric motor M for driving the driving mechanism, and the pulse count of the encoder E is outputted to a control unit 5, which will be described below.

An elevation table 34 is disposed below the rotary mechanism 32. The elevation table 34 is movable by an elevation mechanism, not shown, along a Z-axis guiderail linearly extending in the vertical direction (Z-axis direction in FIG. 1). The Z-axis guiderail and the elevation mechanism are covered with a cover member 35. The cover member 35 is configured to slide along a Y-axis guiderail 36 linearly extending in Y-axis direction.

Each fork 3 (3A, 3B) is a bifurcated member having open distal ends, and has substantially an arcuate shape as a whole, for example. As shown in FIGS. 2 and 3, plural (more than three) retaining claws 30 are arranged at intervals along the inner periphery of the fork 3. The retaining claws 30 project inwardly from the inner periphery of the fork 3. In the illustrated embodiment, the fork 3 and the retaining claws 30 constitute the substrate holding member.

The substrate processing system includes an optical detection unit for inspecting deformation of the fork 3 (3A, 3B). The optical detection unit is configured to be capable of optically detecting the vertical position of the fork 3. In the illustrated embodiment, the optical detection unit is structured as a line sensor 4 configured to form a detection light path, extending horizontally and having a vertical width. The line sensor 4 includes a light emitting device 41 having a number of light emitting elements such as LEDs, and a light receiving device 42.

The light emitting device 41 and the light receiving device 42 are located on a right side and a left side of a front portion of a moving area of the fork 3A (3B), such that, when the transport base 31 located on an inspection position and the fork 3A (3B) to be inspected is moved forward, the fork 3A (3B) interrupts a light path along which detection light travels from the light emitting device 41 to the light receiving device 42. In the illustrated example, the light emitting device 41 and the light receiving device 42 are located on opposed sides of the loading/unloading port 11 of one module 12 of the modules incorporated in the shelf unit U1.

Figure 4:
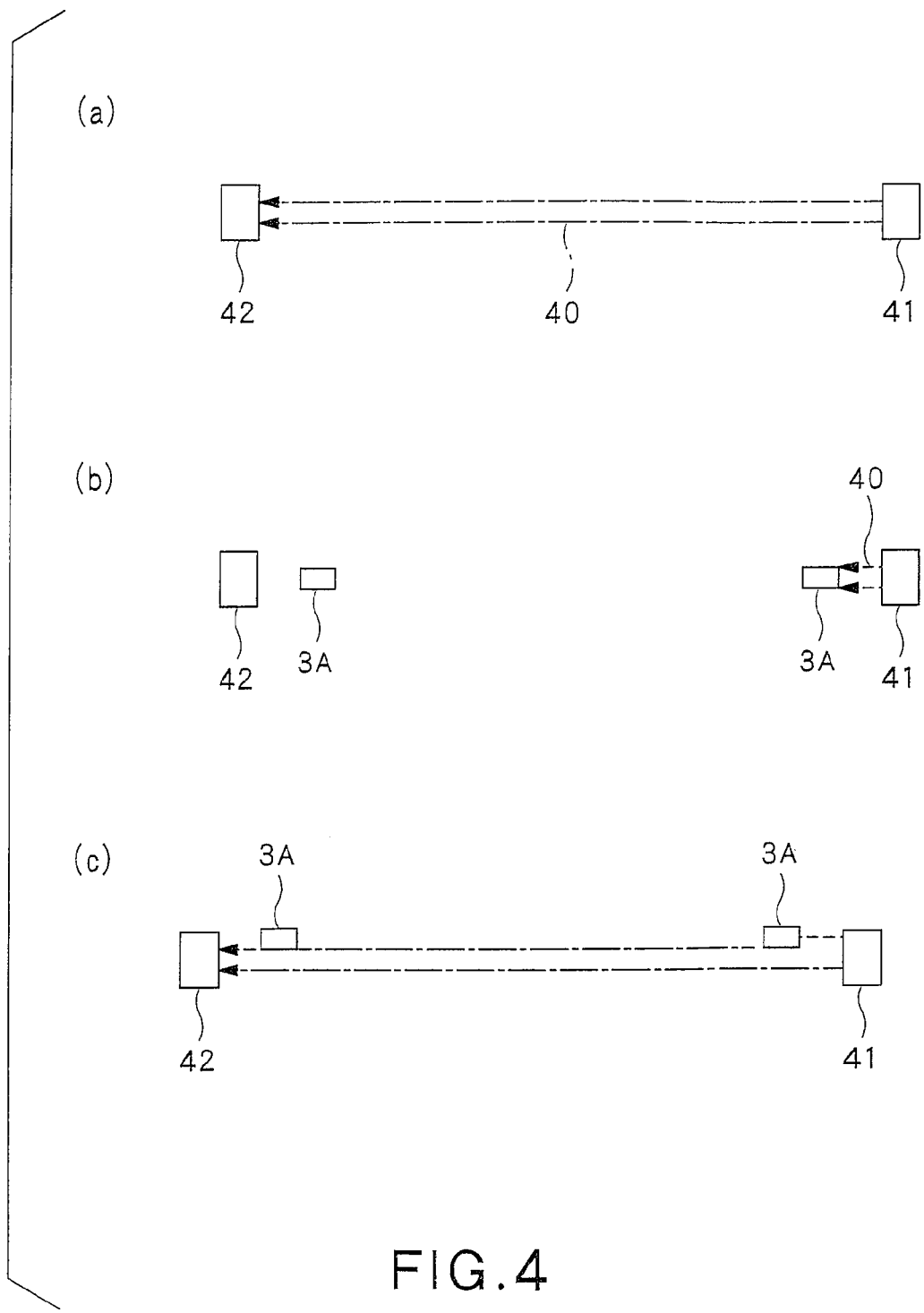
FIG. 4 is a front view of the substrate transport and the optical detection unit.

The light emitting device 41 and the light receiving device 42 of the line sensor 4 are respectively composed of the plural light emitting elements (light emitters) and plural light receiving elements (photodetectors), which are arranged in the vertical direction (Z-axis direction in FIG. 2). As shown in FIG. 4, the vertical width of a light path 40 extending from the light emitting device 41 to the light receiving device 42 is equal to or larger than the thickness of the fork 3A (3B). In FIG. 4, the vertical width of the light path 40 is equal to the thickness of the fork 3A (3B), for the convenience of illustration. As shown in FIG. 4(a), when the fork 3A (3B) does not reach the light path 40 (located above the transport base 31), all the light emitted from the light emitting device 41 falls on the light receiving device 42. When the fork 3A (3B) passes in front of the line sensor 4, all of the light path 40 or a part of the light path 40 is interrupted by the fork 3A (3B). If the fork 3A (3B) is not deformed, the fork 3A (3B) horizontally, linearly extends along the forward and backward movement direction thereof. In this case, as shown in FIG. 4(b), the whole light path 40 is continuously interrupted by the fork 3A (3B) during the passage of the fork 3A (3B) in front of the line sensor 4.

On the other hand, in a case where the fork 3A (3B) is deformed so as to bend upward or downward with respect to the horizontal plane, as shown in FIG. 4(c), when the deformed portion of the fork 3A (3B) passes in front of the line sensor 4, the light path 40 is partially interrupted. Depending on a degree of deformation of the fork 3A (3B), an amount of interruption of the light path 40 by the fork 3A (3B) changes, so that an amount of light falling on the light receiving device 42 changes. Thus, the vertical displacement or position of the fork 3A (3B) can be detected.

The light receiving device 42 has plural light receiving elements, e.g., one hundred light receiving elements which are vertically arrayed. The output voltage of the light receiving device 42 lowers correspondingly to the number of the light receiving elements that are receiving light. The output voltage of the light receiving device 42 is transmitted to the control unit 5 through an A/D (analog/digital) converter 43 shown in FIG. 5.

Figure 5:
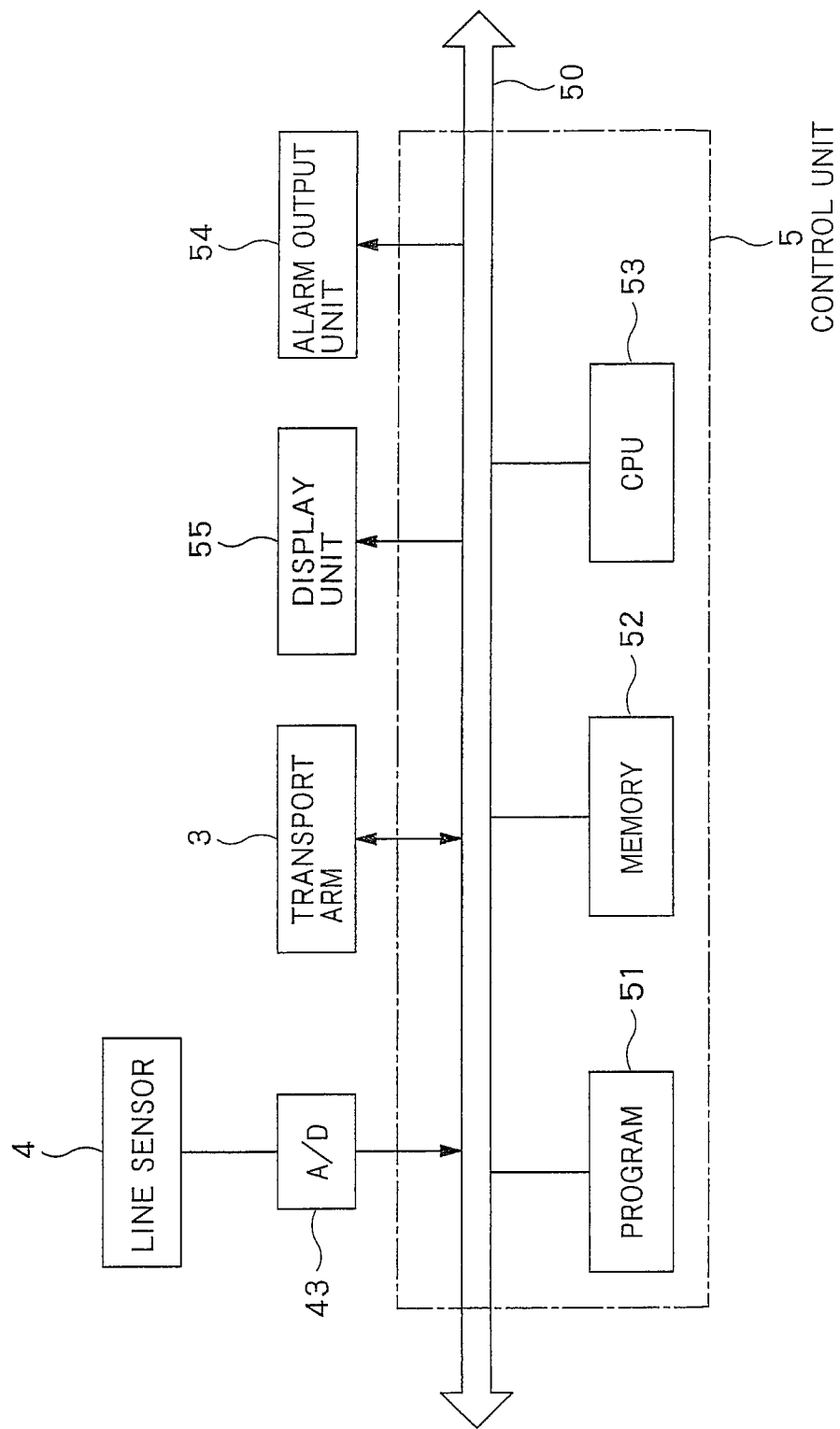
FIG. 5 is a block diagram showing a control unit and relevant parts.

The control unit 5 is described with reference to FIG. 5. The control unit 5 is formed of, e.g., a computer, and includes a data processing section composed of a program 51, a memory 52 and a CPU 53. The program 51 includes various steps for issuing commands according to which control signals are sent from the control unit 5 to the respective functional component parts of the substrate processing system, so as to perform a processing of the substrate, e.g., formation of a resist pattern, and perform the below-described deformation inspection of the forks 3A and 3B. The program 51 is stored in a storage unit, such as a computer storage medium, e.g., a flexible disc, a compact disc, a hard disc or an MO (magneto-optical disc), and is installed in the control unit 5.

The program 51 includes a program for executing an inspection mode that is a mode for inspecting deformation of the forks 3A and 3B, and a program for executing a processing mode that is a mode for performing a predetermined substrate processing. Connected to a bus 50 are the line sensor 4 through the A/D converter 43, the driving mechanism of the transport arm 3, a display unit 55, and an alarm output unit 54. The display unit 55 is formed of, e.g., a computer screen, through which an operator can select the inspection mode or the processing mode. The display unit 55 is configured to display inspection results and graphs, which will be described below.

The program for executing the inspection mode includes a data acquiring program, an inspection program, a judgment program and so on. The data acquiring program constitutes a data acquiring unit configured to acquire data expressing the relationship between the vertical displacement (position) of the fork 3A (3B) and the position of the fork 3A (3B) with respect to the forward and backward direction, when the fork 3A (3B) to be inspected is moved in the forward and backward direction relative to the line sensor 4.

To be specific, the data acquiring program includes the following step group:

locating the transport base 31 on the inspection position;

moving forward the fork 3A (3B) to be inspected toward the light path 40 of the line sensor 4;

reading voltage values as outputs of the light receiving device 42, which are received from the line sensor 4 through the A/D converter 43 at predetermined time intervals, from the point of time when the fork 3A (3B) to be inspected starts moving; and making a correlation data expressing the relationship between a vertical (displacement) position (corresponding to an amount of interruption of the light path 40) of the fork 3A (3B) to be inspected, and the position of the fork 3A (3B) to be inspected in the forward and backward direction (or the elapsed time from the point of time when the fork 3A (3B) to be inspected starts moving).

The judgment program constitutes a judgment unit for judging whether or not deformation occurs in the fork 3A (3B), based on the data acquired by the data acquiring program.

In detail, the judgment program is configured to set (define) a function $Z=f(Y)$ expressing the relationship between the fork position Y with respect to the forward-and-backward moving direction (Y-axis direction in FIG. 2) and the fork position (displacement) Z with respect to the vertical direction (Z-axis direction in FIG. 2); configured to calculate values, at respective fork positions Yi, of the second order derivative $Z''=f''(Y)$ which is derived by differentiating the function $Z=f(X)$ twice with respect to the fork position Y; and configured to judge whether or not deformation occurs in the fork 3A (3B) based on the values of the second order derivative.

The alarm output unit 54 outputs a predetermined alarm, if the judgment program judges that deformation occurs in the fork 3A (3B). The alarm output includes error display on the display unit 55, illumination of an alarm lamp, generation of alarm sound, etc.

Figure 6:
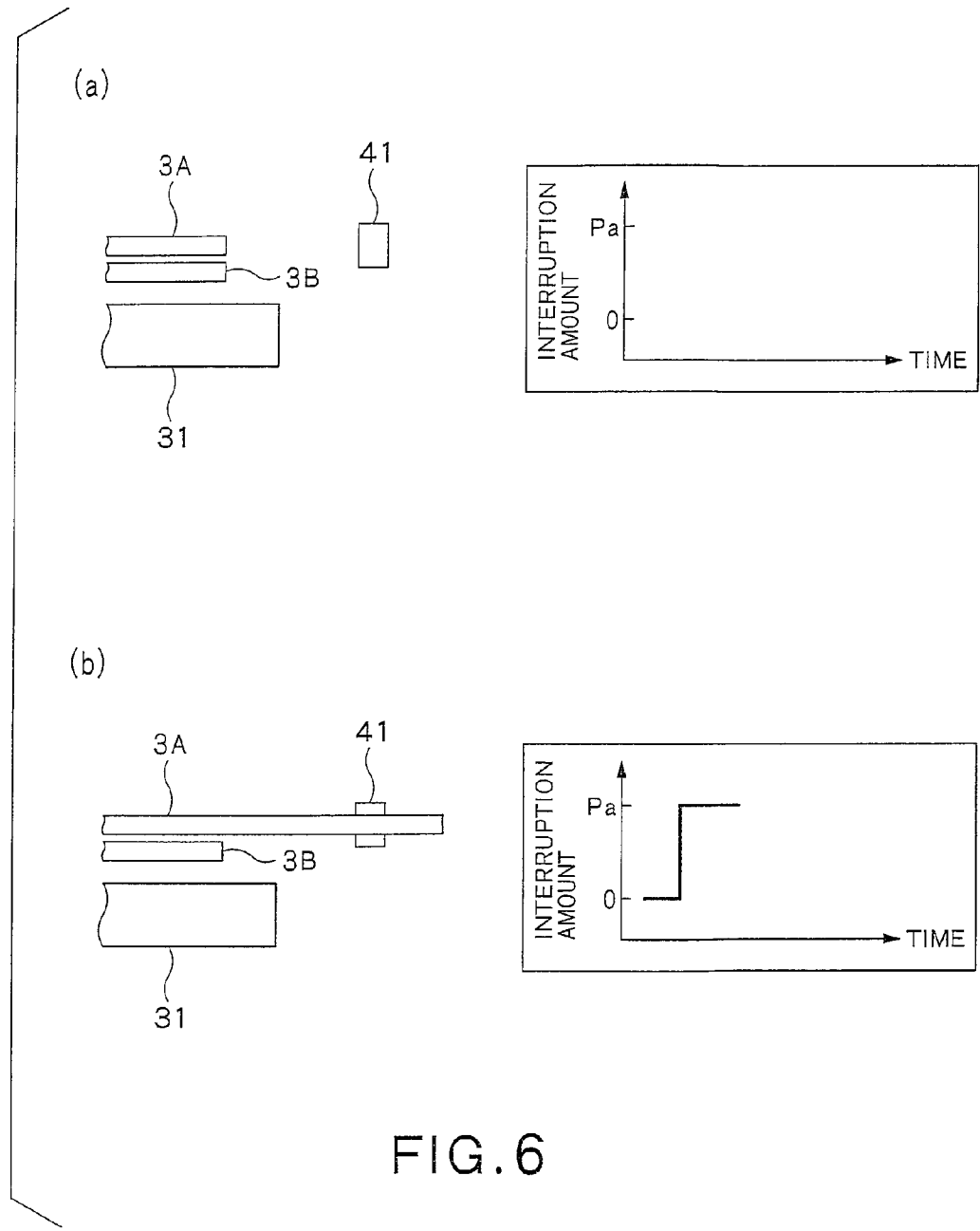
FIG. 6 shows schematic side views each showing the positional relationship between a substrate holding member and the optical detection unit, and also shows corresponding graphs each showing the change of an amount of interruption of the light path of the optical detection unit with time, in a case where the substrate holding member is not deformed.
Figure 7:
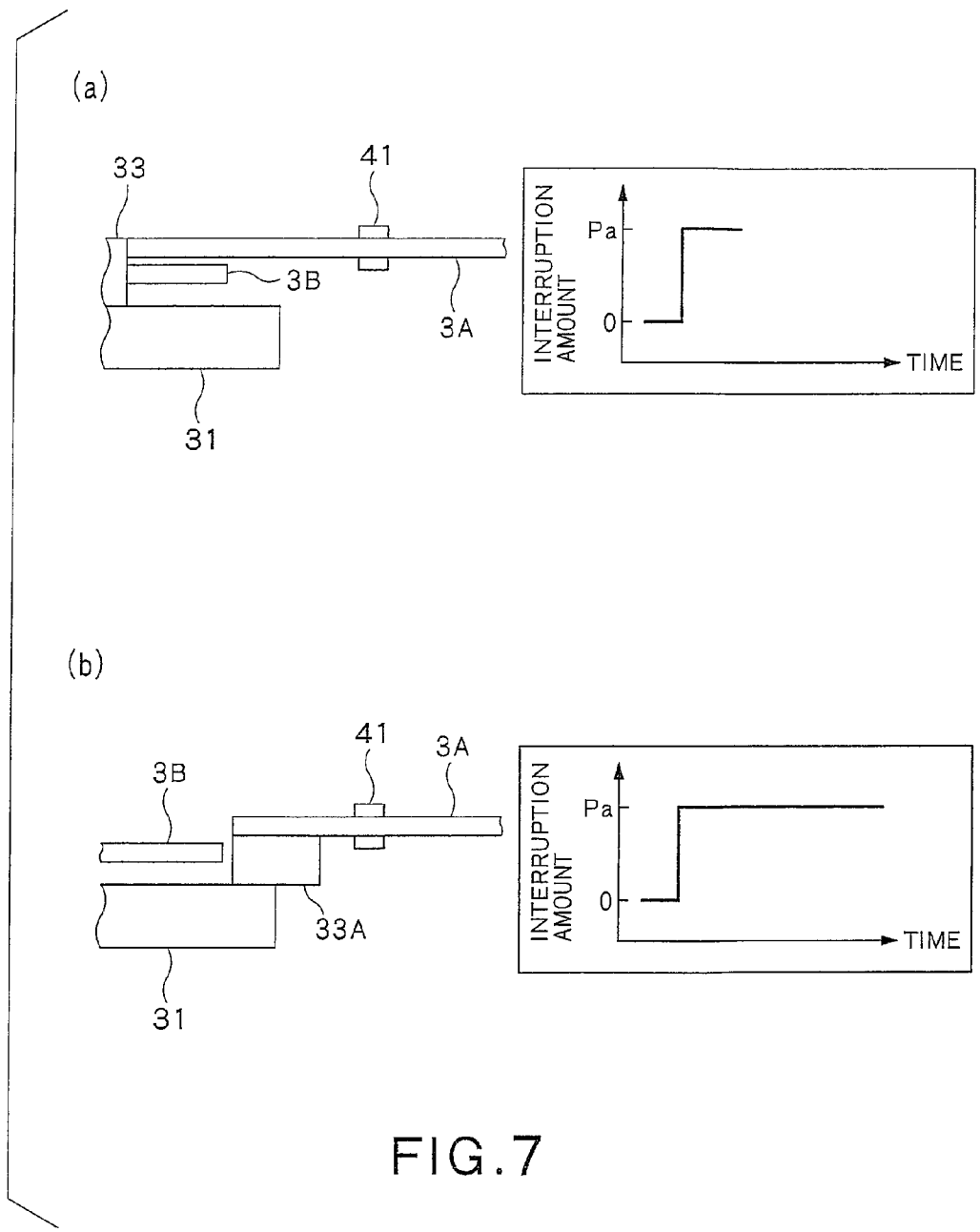
FIG. 7 shows schematic side views each showing the positional relationship between a substrate holding member and the optical detection unit, and also shows corresponding graphs each showing the change of an amount of interruption of the light path of the optical detection unit with time, in a case where the substrate holding member is not deformed.
Figure 8:
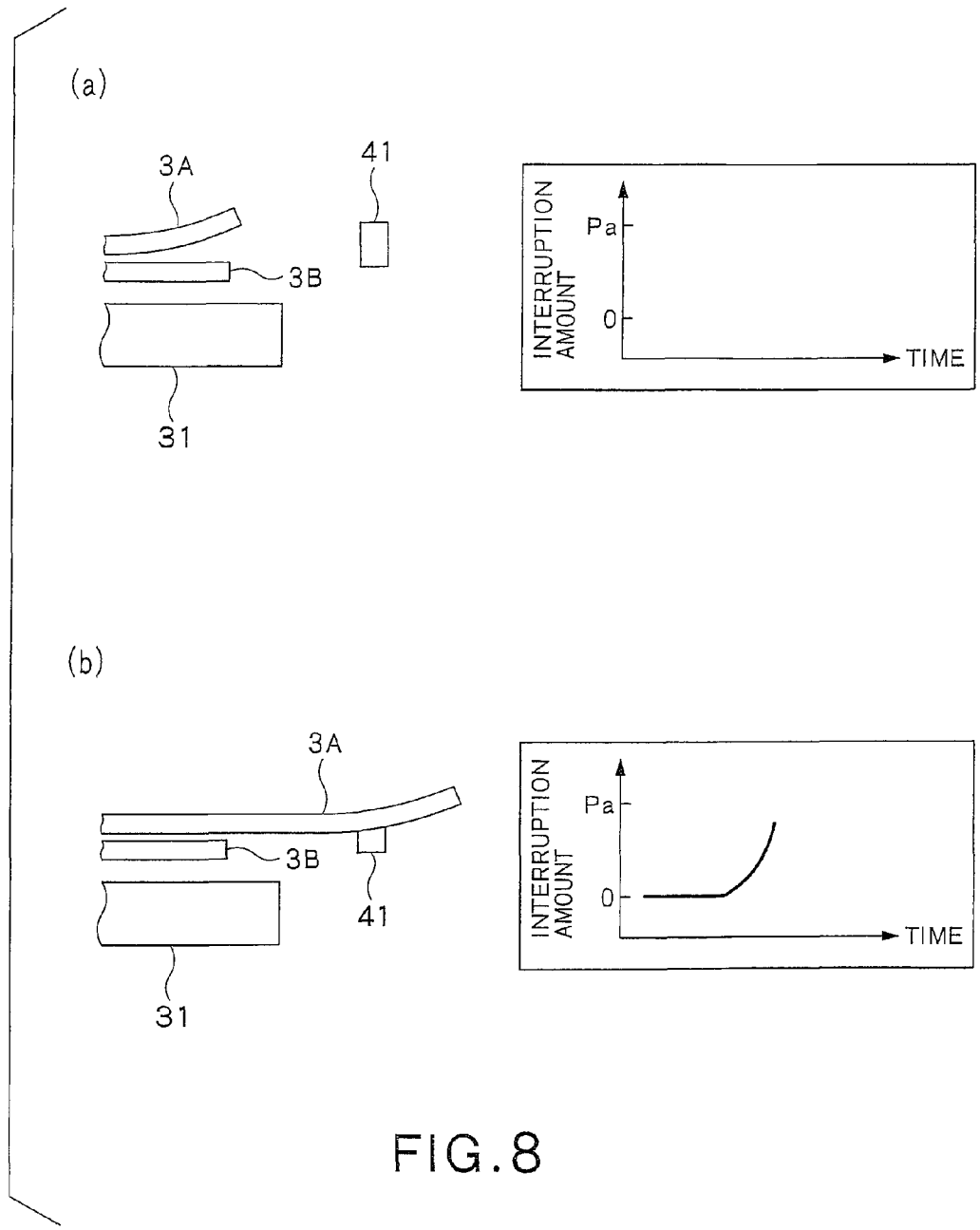
FIG. 8 shows schematic side views each showing the positional relationship between a substrate holding member and the optical detection unit, and also shows corresponding graphs each showing the change of an amount of interruption of the light path of the optical detection unit with time, in a case where the substrate holding member is deformed.
Figure 9:
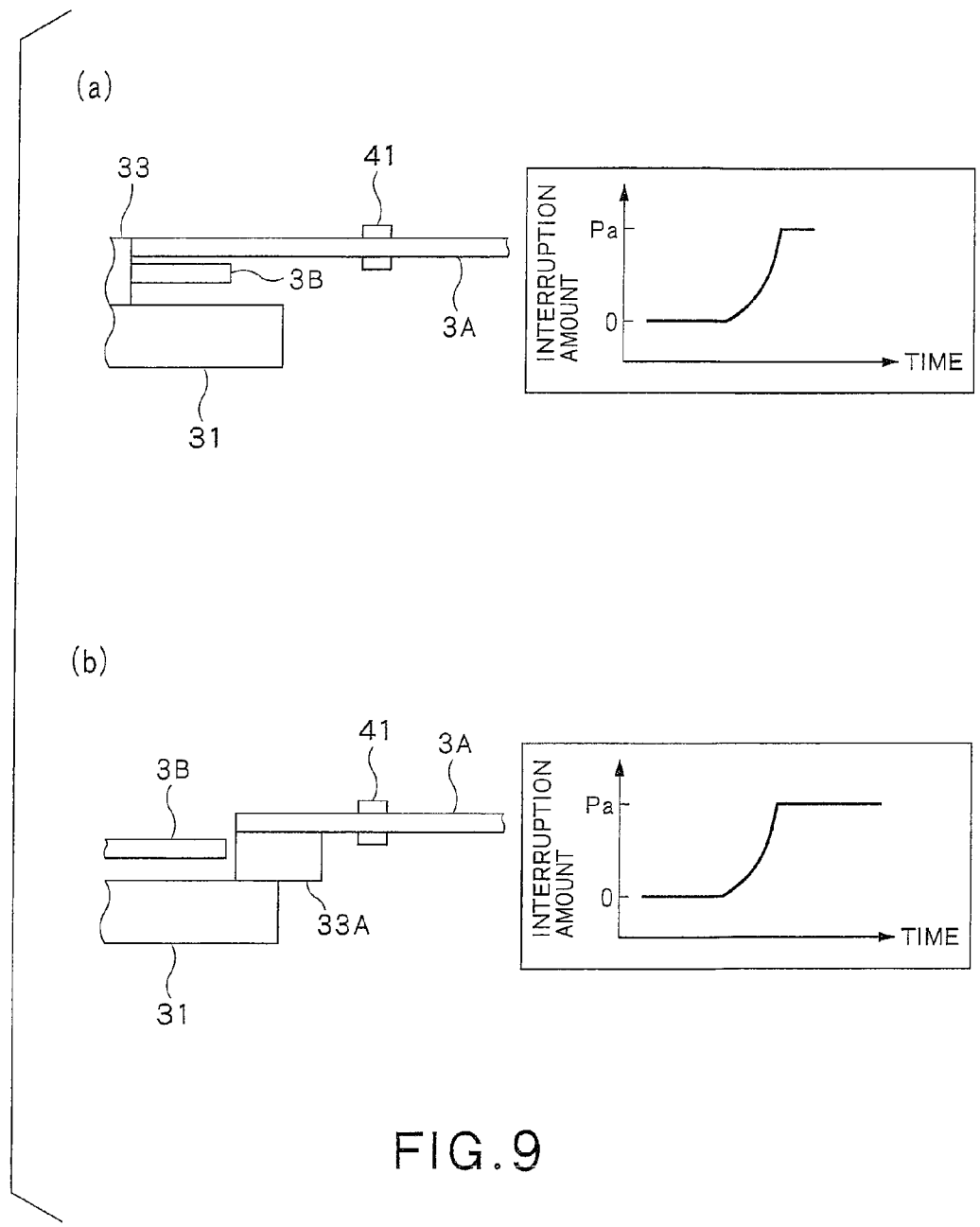
FIG. 9 shows schematic side views each showing the positional relationship between a substrate holding member and the optical detection unit, and also shows corresponding graphs each showing the change of an amount of interruption of the light path of the optical detection unit with time, in a case where the substrate holding member is deformed.

FIGS. 6 to 9 shown an example of data acquired by the data acquiring unit (data accruing program). The description will be made for the case where the fork 3A is inspected. The "position of the fork 3A in the forward and backward direction (fork position Y)" is replaced with the "time (elapsed time)". Since the fork 3A moves at the constant speed at least when the fork 3A is passing in front of the line sensor 4, the "fork position Y" can be expressed by a linear function of the "time". Thus, even if the "fork position Y" is replaced with the "time period", there is no problem in judging deformation based on the below-described principle. As a matter of course, judgment may be performed based on the actual "fork position Y" with the use of an output of the encoder E shown in FIG. 2. The vertical position of the fork 3A (fork position Z) is acquired based on an amount of interruption of the light path 40, which is described above. In the graphs shown in FIGS. 6 to 9, "time" is shown on the axis of abscissa, and "amount of interruption" is shown on the axis of ordinate. FIGS. 6 and 7 respectively show data obtained upon a normal condition in which no deformation occurs in the fork 3A, and FIGS. 8 and 9 show data obtained upon an abnormal condition in which deformation occurs in the fork 3A. FIGS. 6(a) and 8(a) show a condition in which the transport base 31 is located on the inspection position and the forward movement of the fork 3A to be inspected toward the line sensor 4 is started, FIGS. 6(b), 7(a), 8(b) and FIG. 9(a) show a condition in which the fork 3A is moving forward, and FIGS. 7(b) and 9(b) show a condition in which the forward movement of the fork 3A is finished, respectively.

Data obtained upon the normal condition are firstly described. As shown in FIG. 6(a), in a case where there is no deformation in the fork 3A, when the distal ends of the fork 3A are located on a position in front of the line sensor 4, the light path 40 is not interrupted so that the amount of interruption is zero. When the distal ends of the fork 3A start to pass through or pass across the light path 40, a part of the whole vertical length of the light path 40 corresponds to the vertical thickness of the fork 3A is interrupted by the fork 3A. FIGS. 6 and 7 show the graphs illustrating data expressing the relationship between the amount of interruption and the time. The amount of interruption is zero in the first place, and the amount of interruption abruptly jumps up to a maximum value Pa when the distal end of the fork 3A starts to pass through the light path 40 of the line sensor 4 (see FIG. 6(b)). After that, since the light path 40 is continuously interrupted by the fork 3A, the amount of interruption is kept at the maximum value Pa (see FIGS. 7(a) and 7(b)). Herebelow, the state where the amount of interruption is zero is referred to as "OFF", and the state where the amount of interruption is larger than zero is referred to as "ON".

On the other hand, in a case where the fork 3A is deformed, for example, the distal end side of the fork 3A is curved upward as shown in FIG. 8, when the distal end of the fork 3A starts to pass through the light path 40, the light path 40 is gradually interrupted by the fork 3A from an upper side of the light path 40. Thus, as shown in the graphs (FIGS. 8 and 9) expressing the relationship between the amount of interruption and the time, "ON" state starts at a point of time when the distal ends of the fork 3A start to pass through the light path 40, and the amount of interruption non-linearly increases (see FIG. 8(b)). Thereafter, the horizontally extending portion (not-curved portion) of the fork 3A passes through the light path 40. At this time, since the light path 40 is interrupted by an amount corresponding to the thickness of the fork 3A, the amount of interruption becomes the maximum value Pa (see FIGS. 9(a) and 9(b)).

In a case where the distal end side of the fork 3A is curved downward when the distal ends of the fork 3A start to pass through the light path 40, the light path 40 is gradually interrupted by the fork 3A from the lower side of the light path 40. Thus, "ON state" starts at a point of time when the distal ends of the fork 3A start to pass through the light path 40, and the amount of interruption also non-linearly increases.

In a case where the fork 3A is deformed such that the center portion of the fork 3A is curved upward or downward relative to the horizontal plane, when the deformed portion of the fork 3A is passing through the light path 40, a part of the light path 40 is not interrupted by the fork 3A. Thus, in the interruption amount line indicating the change of the amount of interruption with time, a curved portion appears corresponding to the time period during which the deformed portion of the fork 3A is passing through the light path 40.

Figure 10:
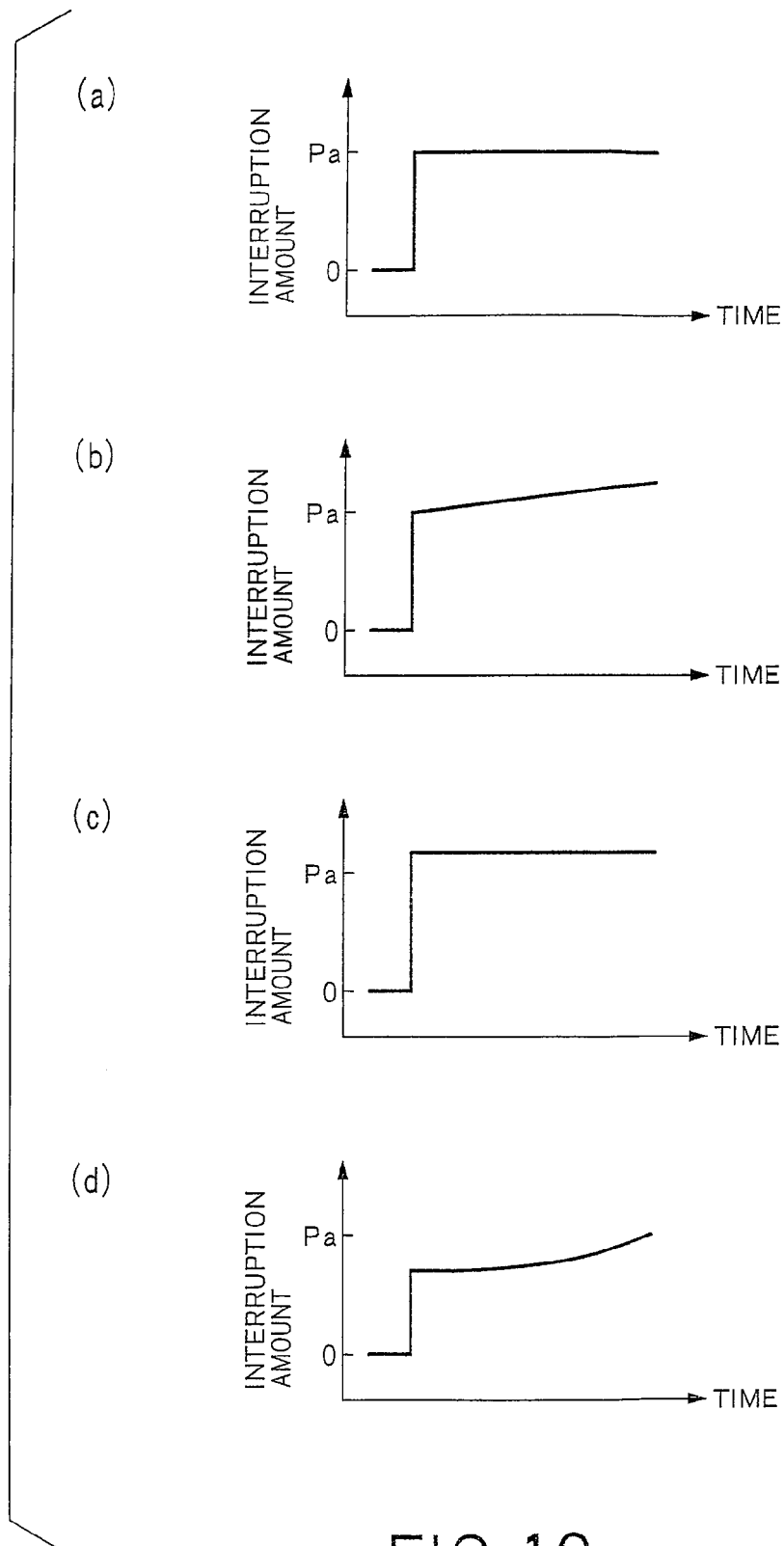
FIG. 10 shows graphs each showing the change of an amount of interruption of the light path of the optical detection unit with time in respective, conditions of the substrate holding member.
Figure 11:
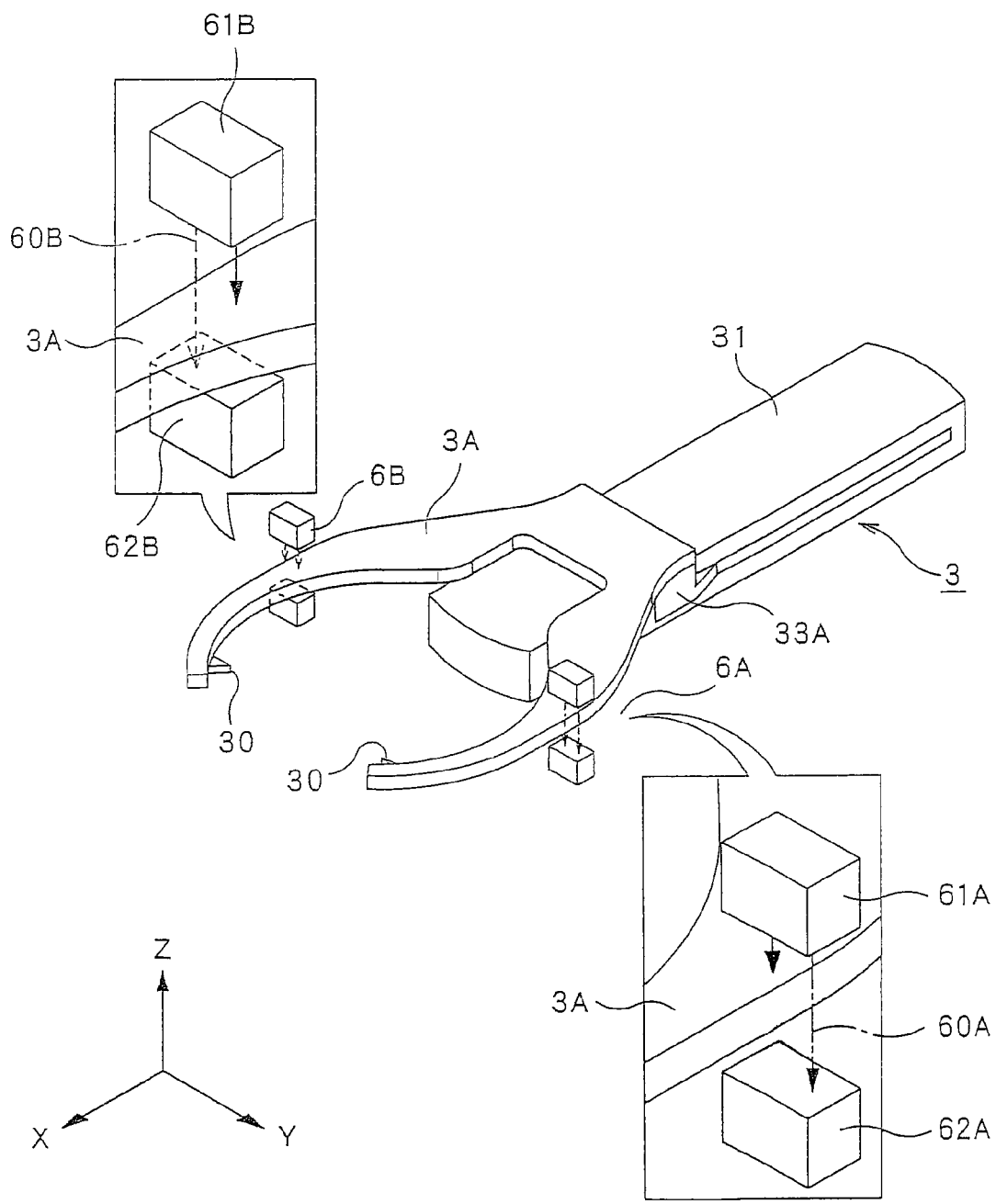
FIG. 11 is schematic perspective view of a substrate transport apparatus and an optical detection unit in a second embodiment.

At a point of time (ti) when the curved portion is interrupting the light path 40, the value of the second order derivative P''=f''(t), which is derived by differentiating with respect to time "t" the function P=f(t) expressing the relationship between the amount of interruption P (which is a linear function of the vertical position of the fork 3A (3B)) and the time "t" (which may be the position Y of the fork 3A (3B), is positive. On the other hand, as shown in FIGS. 10(a) and 10(c), when the amount of interruption jumps up and becomes thereafter constant (value Pa), the value of the first order derivative P'=f'(t) is always zero. As shown in FIG. 10(b), if the amount of interruption is a linear function of the time, the value of the first order derivative P'=f'(t) is constant. In either case, the value of the second order derivative is zero.

In a case where the graph as shown in FIG. 10(b) is obtained, it is not judged that the fork 3A is deformed, but it is judged that the fork 3A is inclined because of an insufficient mounting accuracy of the fork 3A. Alternatively, in a case where the graph as shown in FIG. 10(c) in which the actual detection value of the amount of interruption exceeds the theoretical maximum value Pa, such a situation is caused by adjustment error upon adjustment of the position of the fork 3A or by a backlash of the timing belt of the elevation mechanism. Thus, also in this case, it is not judged that the fork 3A is deformed. Thus, the judgment program judges that the fork 3A is not deformed when the graphs shown in FIGS. 10(a) to 10(c) are obtained, but judges that the fork 3A is deformed when the graph shown in FIG. 10(d) is obtained.

Practically, the judgment program performs digital data processing for calculating the value of the second order derivative. Specifically, the amount of interruption P is sampled at every 0.1 seconds. Based on the value Pn of the amount of interruption obtained by the n-th sampling from the point of time when the ON state (light path interrupted) is established, and based on the value Pn−1 of the amount of interruption obtained by the (n−1)th sampling, the value "dn" (at the time when the n-th sampling is done) of the first order derivative (which is derived by differentiating the function expressing the relationship between the amount of interruption and the time with respect to the time) is calculated according to the below formula (1). Further, the value "Dn" (at the time when the n-th sampling is done) of the second order derivative (which is derived by twice differentiating the function expressing the amount of interruption and the time with respect to the time) is calculated according the below formula (2).

$$dn = Pn - P(n-1) \quad (1)$$

$$Dn = dn - d(n-1) \quad (2)$$

The number of times (sampling) at which the value of the second order derivative value is positive is counted. When the counted number is not less than a predetermined threshold, it is judged that the fork 3A is deformed. Alternatively, it is possible to set a larger sampling interval, and to judge that the fork 3A is deformed when once the value Dn of the second order derivative becomes positive. In this case, due to wavering of the fork 3A during the movement thereof and/or noises of the line sensor 4, even when the data has temporary fluctuation caused by any reason other than the deformation of the fork 3A, the fluctuation will not affect the judgment, and whether or not deformation occurs in the fork 3A can be judged precisely.

Next, the operation of the inspection mode is described. The inspection mode is selected, for example, when an alarm informing a transport error is outputted from the substrate processing system, because a wafer cannot be transported at a predetermined timing between the modules. When the inspection mode is selected, the inspection program is executed.

At first, the transport base 31 of the transport arm 3 is moved to the inspection position. The inspection position is a position at which the light path 40 of the line sensor 4 is interrupted, when the fork 3A is moved forward with the transport base 31 being opposed to the module 12 of the shelf unit U1, as long as the fork 3A is not deformed. Then, the fork 3A is moved forward, and data sampling is started simultaneously with the starting of the forward movement of the fork 3A, so as to acquire a data expressing the relationship between the vertical position of the fork 3A (or the amount of interruption of the light path 40) and the position of the fork 3A in the forward and backward direction (or the time), as described above. Base on the data, whether or not deformation occurs in the fork 3A is judged, and the inspection result is displayed on the display unit 55.

When it is judged that the fork 3A is not deformed, the fork 3A is moved backward, and the transport base 31 is elevated up to the inspection position at which the fork 3B is inspected. Then, whether or not deformation occurs in the fork 3B is inspected in the same way. On the other hand, when it is judged that the fork 3A is deformed, a predetermined alarm is outputted from the alarm output unit 54. At this time, it is possible to stop the substrate processing system, so as to perform maintenance of the fork 3A. Alternatively, the maintenance of the fork 3A may be performed, after deformation in the fork 3B has been inspected.

The inspection result of the fork 3B is similarly displayed on the display unit 5. When the fork 3B is deformed, a predetermined alarm is outputted by the alarm output unit 54.

Then, the substrate processing system is stopped, and the maintenance of the fork 3B is performed. When both of the forks 3A and 3B are normal, or when the forks 3A and 3B are recovered to the normal state, the processing mode is selected through the display unit 55, and the substrate processing is restarted.

In the above embodiment, whether deformation occurs in the fork 3A (3B) is inspected, based on the data expressing the relationship between the vertical position (displacement) of the fork 3A (3B) to be inspected (or the amount of interruption of the light path 40) and the position of the fork 3A (3B) in the forward and backward direction (or time). Thus, reliable deformation inspection can be performed.

Further, since the data is acquired while the fork 3A (3B) is moved forward across the line path 40 of the line sensor 4, whether deformation occurs in the fork 3A (3B) can be detected over the entire length from the distal ends to the proximal end of the fork 3A (3B). Thus, even if only a portion of the fork 3A (3B) is deformed, the deformation can be detected without fail.

Furthermore, since whether deformation occurs in the fork 3A (3B) can be automatically inspected when the inspection mode is selected by the operator, it is not necessary for the operator to carry out a lot of inspecting steps in a narrow, dark interior space of the substrate processing system, whereby the operator's load can be reduced. In addition, since the time required for inspecting deformation of the fork 3A (3B) can be reduced, the average recovery time can be lessened. In addition, since the vertical position of the fork 3A (3B) is detected, the height position of the fork 3A (3B) can be confirmed simultaneously with the deformation inspection of the fork 3A (35).

Next, a second embodiment is described with reference to FIGS. 11 to 18. The second embodiment uses an optical detection unit configured to optically detect the displacement or position of the fork 3A, 3B in the direction perpendicular to the moving direction (this direction means the Y-axis direction in FIG. 11 and is referred to as "right and left direction" or "Y-axis direction" herebelow) of the fork 3A, 3b; and acquires data expressing the relationship between the position of the fork 3A, 3B in the right and left direction and the position of the fork 3A, 3B in the forward and backward direction (X-axis direction); and judges whether deformation occurs in the fork 3A, 3B based on the acquired data. The illustration of the fork 3B is omitted in FIG. 11 for the simplicity of the drawing.

A line sensor (6A, 6B) may be used as the optical detection unit, for example. The line sensors 6A and 6B are arranged on the right and left sides of the forks 3A, 3B in the forward and backward direction. The line sensor 6A includes a light emitting device 61A having a plurality of light emitting elements, such as LEDs, and a light receiving device 62A. Similarly, the light sensor 6B includes a light emitting device 61B and a light receiving device 62B. The line sensor 6A, 6B are each configured to form a light path (60A, 60B) extending vertically and having a width in the right and left direction.

The light emitting devices 61 (61A, 61B) and the light receiving devices 62 (62A, 62B) are located on the right end and the left end of the moving area of the fork 3A (3B) in plan view. The light emitting device 61 and the light receiving device 62 are positioned above and below the fork 3A (3B) to be vertically opposed to each other, such that, when the transport base 31 is located in the inspection position and the fork 3A (3B) to be inspected is extended (moved) forward, the fork 3A (3B) passes across the light path 60A, 60B. In the illustrated embodiment, the light emitting devices 61A and 61B and the light receiving devices 62A and 62B are disposed on positions near the loading/unloading port 11 of one module 12 of the modules incorporated in the shelf unit U1.

Figure 12:
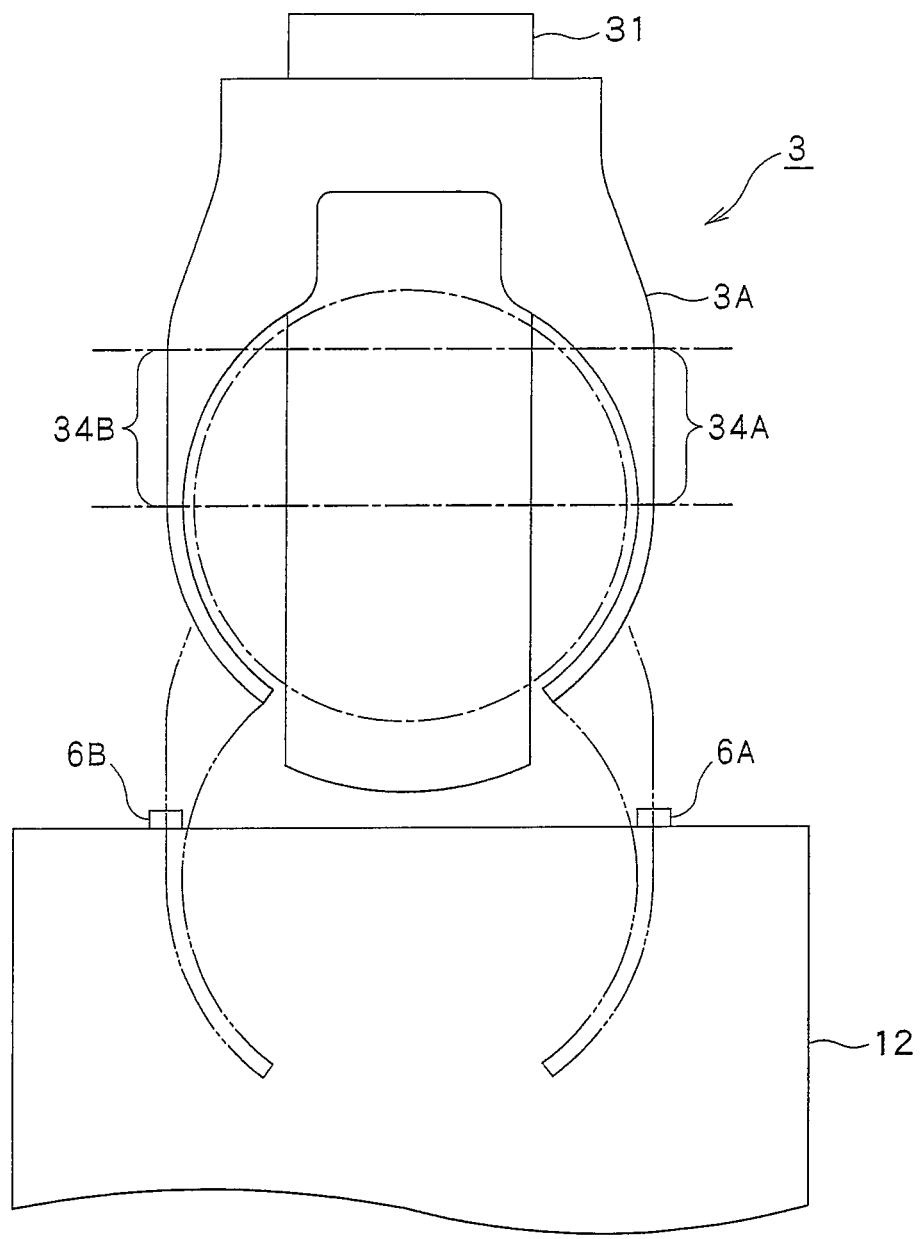
FIG. 12 is a top plan view of the substrate transport apparatus and the optical detection unit in the second embodiment.

As shown in FIG. 12, each of the forks 3A and 3B includes portions 34A and 34B, each of which has an outer periphery extending parallel with the forward and backward direction of the fork 3A and 3B. When the portion to be detected 34A (34B) of the fork 3A or 3B pass through the space between the light emitting device 61 (61A (61B)) and the light receiving device 62 (62A (62B)) of the line sensor 6 (6A (6B)), a part of the whole width in the right and left direction of the light path 60A (60B) is interrupted by the portion 34A (34B).

In the second embodiment, a control unit includes: a data acquiring unit configured to acquire data expressing the relationship between the position (displacement) of the fork 3A and 3B in the right and left direction and a position of the fork 3A and 3B in the forward and backward direction, when the fork 3A (3B) is moved to pass across the light paths 60A and 60B of the line sensors 6 (6A, 6B); a data storing unit configured to store a reference data, which expresses the relationship between the position of the fork 3A (3B) in the right and left direction and the position of the fork 3A (3B) in the forward and backward direction, and which is obtained when a fork 3A (3B) without deformation is moved to pass across the light paths 60A and 60B; and a judging unit configured to judge whether deformation occurs in the fork 3A (3B) by comparing the acquired data and the reference data with each other.

Figure 13:
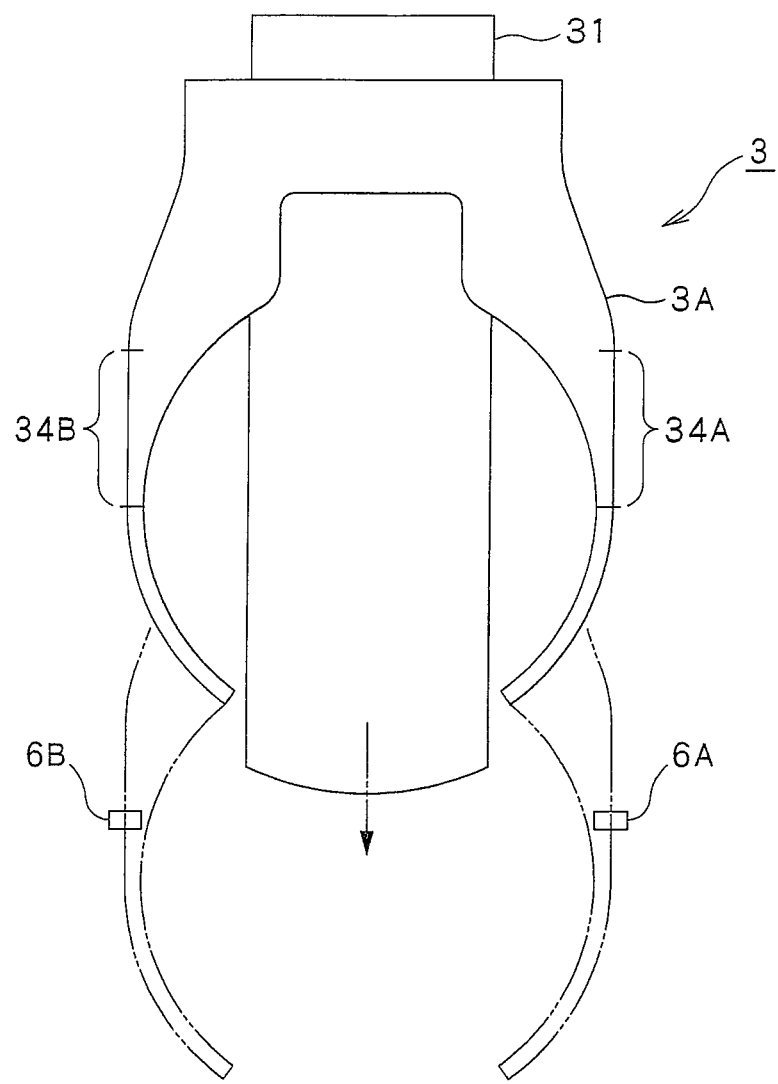
FIG. 13 is a top plan view showing a substrate holding member without deformation.
Figure 14:
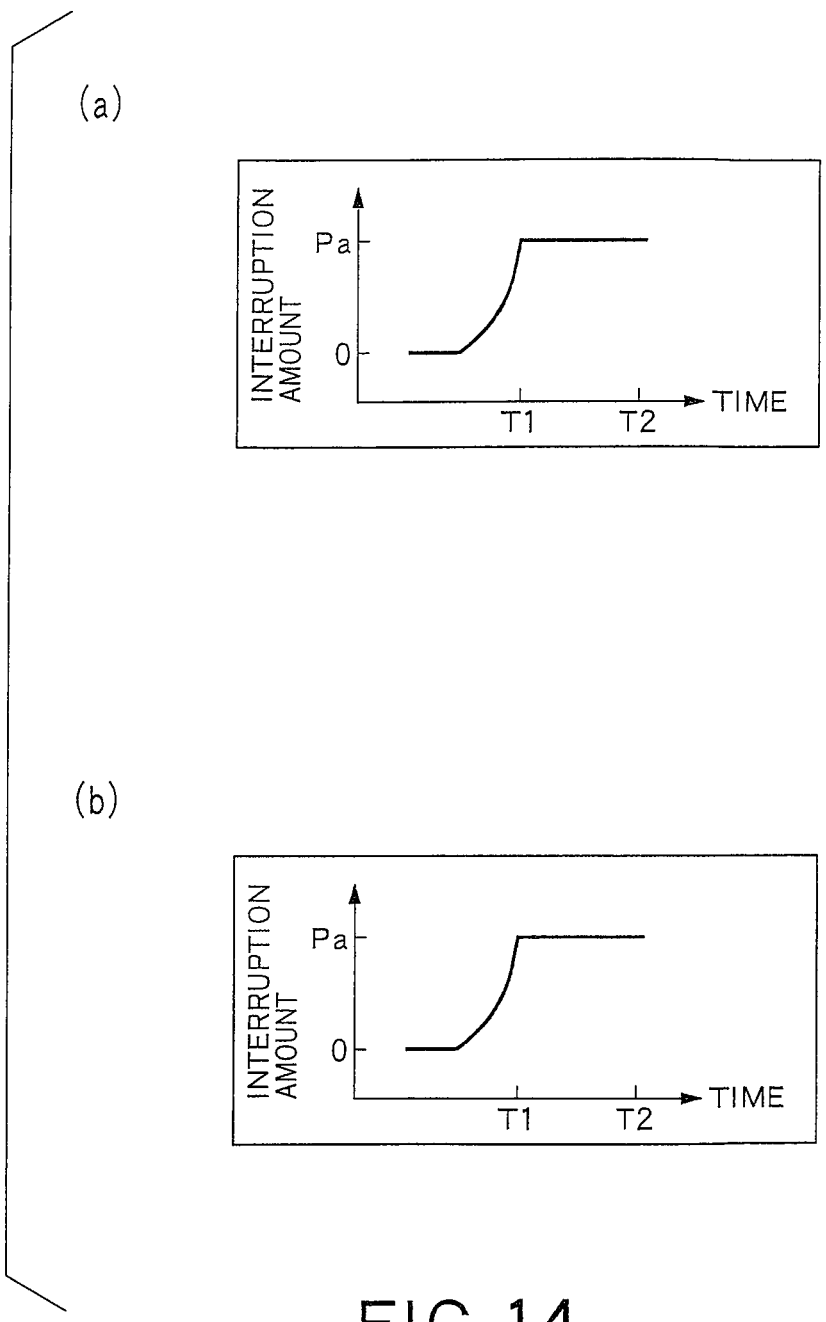
FIG. 14 shows graphs each showing the change of an amount of interruption of the light path of the optical detection unit with time, in a case where the substrate holding member shown in FIG. 13 is inspected.

A case in which the fork 3A without deformation is moved to pass across the light paths 60A and 60B of the line sensor 6 (6A, 6B) is described with reference to FIGS. 13 and 14. FIG. 14 is a graph showing a reference interruption amount line expressing the relationship between the position of the not-deformed fork 3A in the right and left direction and the position of the not-deformed fork 3A in the forward and backward direction, wherein FIG. 14(a) is based on the data detected by the line sensor 6A, and FIG. 14(b) is based on the data detected by the line sensor 6B. Also in this second embodiment, the position of the fork 3A in the right and left direction is acquired based on the amount of interruption of each of the line paths 60A and 60B, and the position of the fork 3A in the forward and backward direction is acquired based on the time. In FIG. 14, the time period from the time point T1 to the time point T2 corresponds to a time period when the portions to be detected 34A and 34B of the fork 3A are passing through the line paths 60A and 60B of the line sensors 6A and 6B. In the case where the fork 3A is not deformed, when the portions to be detected 34A and 34B pass through the line paths 60A and 60B of the line sensors 6A and 6B the value of the amount of interruption is "Pb".

Figure 15:
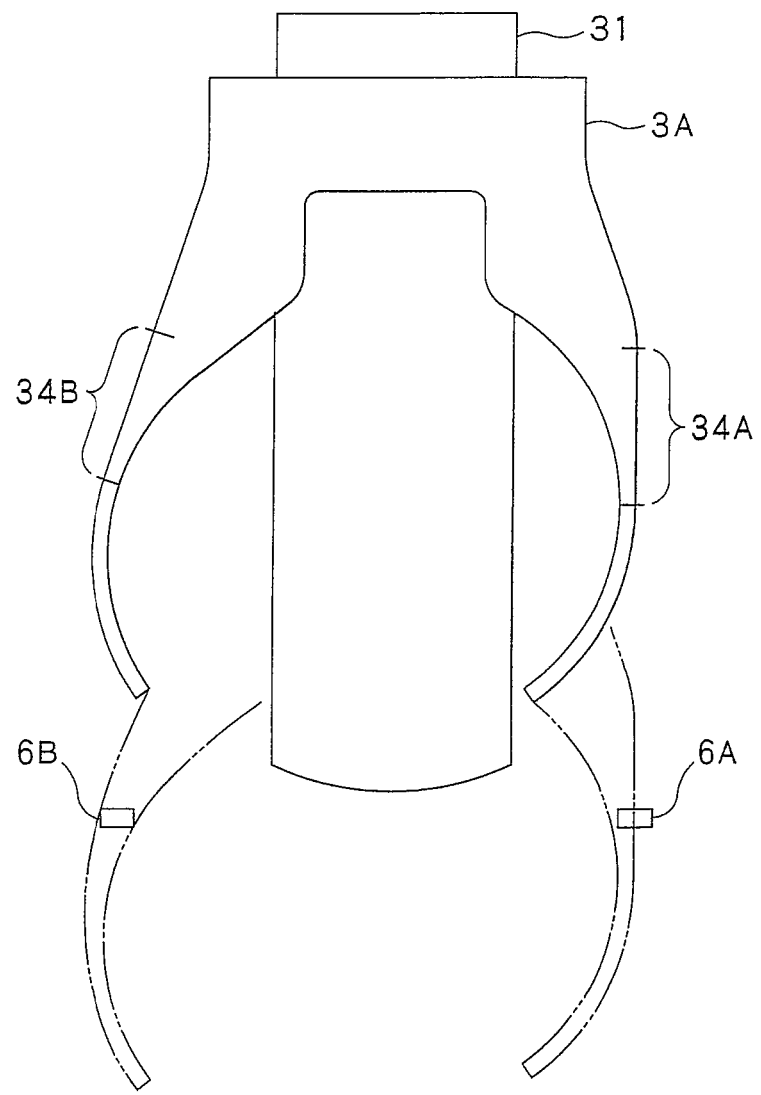
FIG. 15 is a top plan view showing a substrate holding member with deformation.
Figure 16:
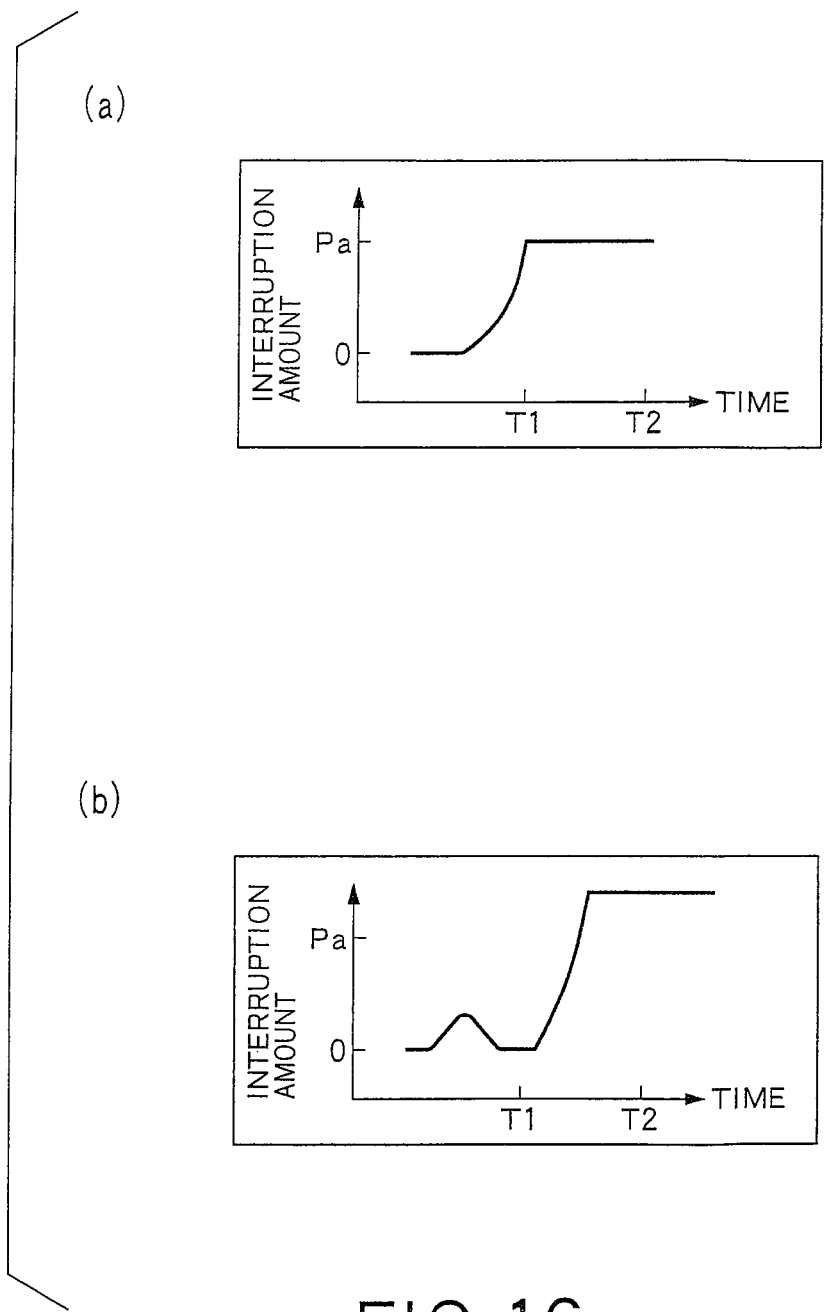
FIG. 16 shows graphs each showing the change of an amount of interruption of the light path of the optical detection unit with time, in a case where the substrate holding member shown in FIG. 15 is inspected.
Figure 17:
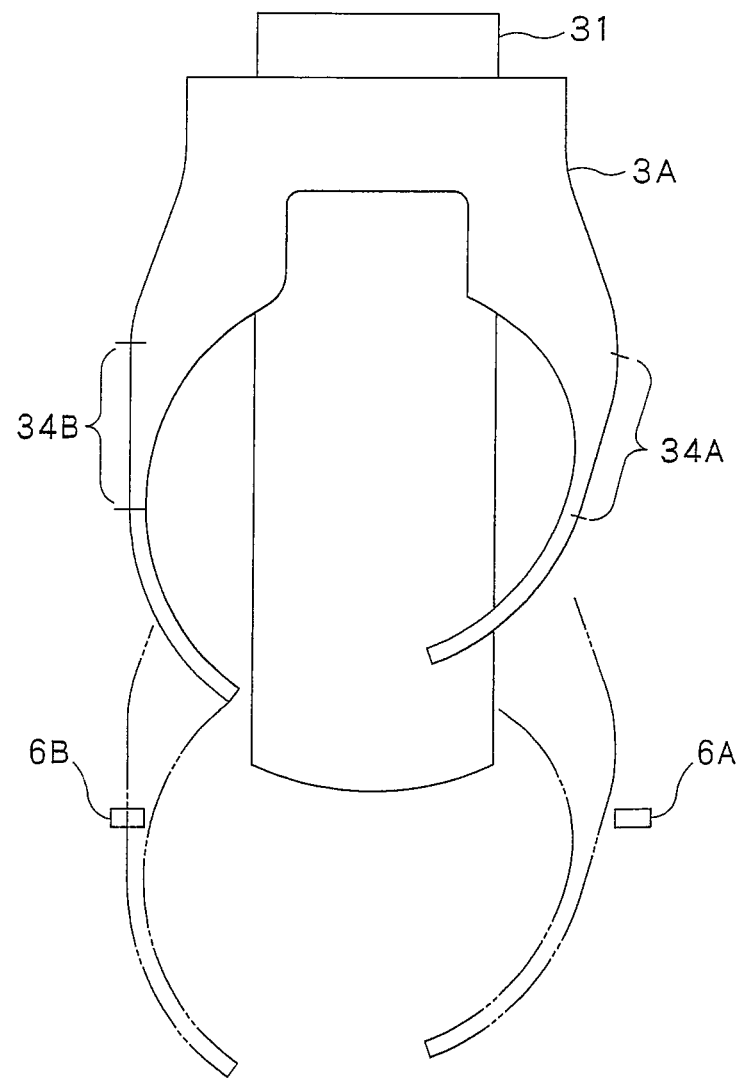
FIG. 17 is a top plan view showing a substrate holding member with deformation.
Figure 18:
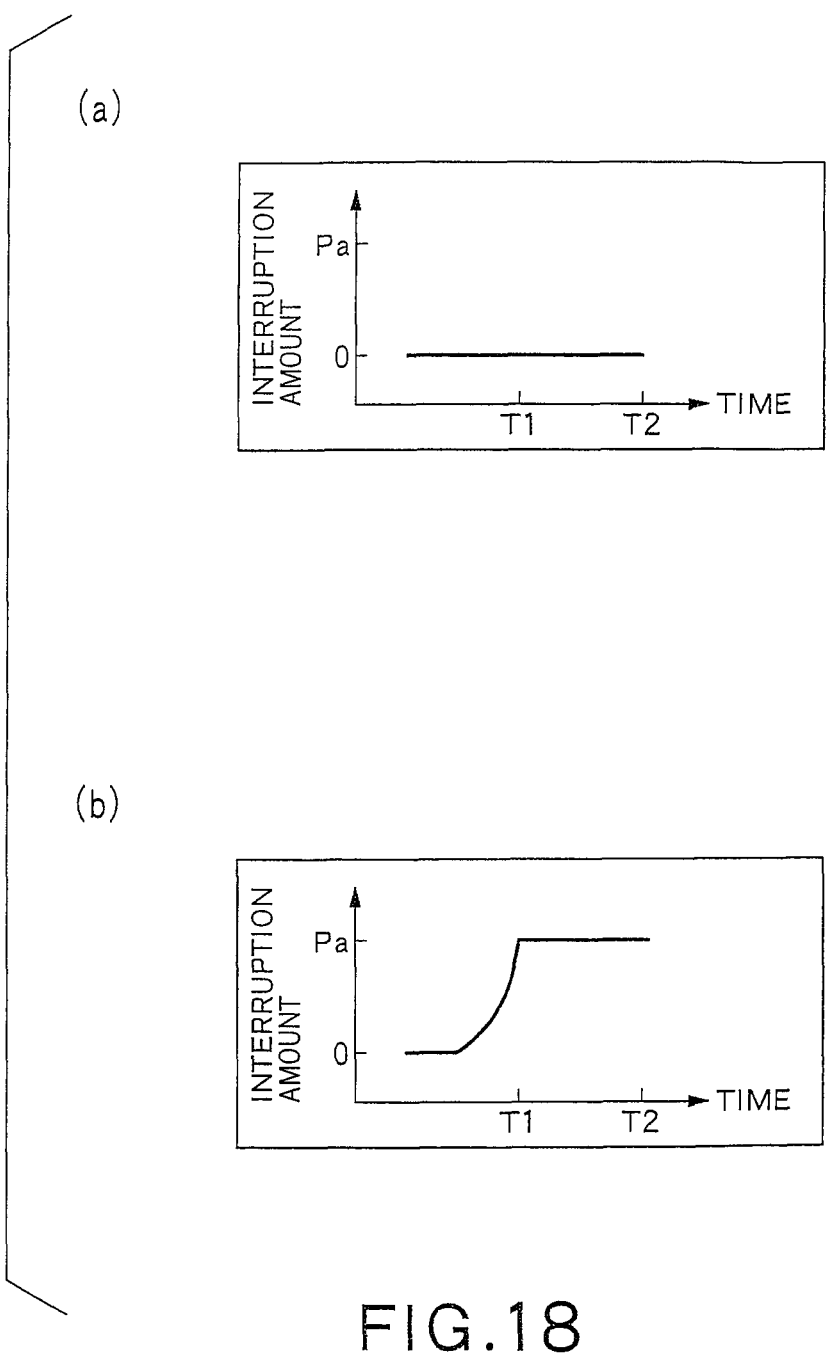
FIG. 18 shows graphs each showing the change of an amount of interruption of the light path of the optical detection unit with time, in a case where the substrate holding member shown in FIG. 17 is inspected.

On the other hand, a case where the deformed fork 3A is moved to pass through the light paths 60A and 60B of the line sensor 6 (6A, 6B) is described with reference to FIGS. 15 to 18. In this example, the fork 3A is deformed such that the distal ends of the fork 3A have an abnormal opening. FIGS. 15 and 16 show that the fork 3A is deformed such that the distal ends thereof spread in the right and left direction; FIGS. 17 and 18 show that the fork 3A is deformed such that the distal ends thereof are narrowed in the right and left direction.

In the example shown in FIG. 15, the fork 3A is deformed such that the left part thereof is bent outward. Thus, in the graph in FIG. 16 showing the data expressing the relationship between the position of the fork 3A in the right and left direction (amount of interruption) and the position of the fork 3A in the forward and backward direction (time), the graph based on the data detected by the line sensor 6A (FIG. 16(a)) is the same as the graph showing the normal condition, but the graph based on the data detected by the line sensor 6B (FIG.

16(b)) considerably differs from the graph showing the normal condition. Namely, between the time point T1 and the time point T2, a part of the interruption amount line of the graph indicates a value larger than the amount of interruption Pb in the normal condition.

In the example shown in FIG. 17, the fork 3A is deformed such that the right part of the fork 3A is bent inward. Thus, in the graph in FIG. 18 showing the data expressing the relationship between the position of the fork 3A in the right and left direction (amount of interruption) and the position of the fork 3A in the forward and backward direction (time), the graph based on the data detected by the line sensor 6B (FIG. 18(b)) is the same as the graph showing the normal condition, but the graph based on the data detected by the line sensor 6A (FIG. 16(a)) considerably differs from the graph showing the normal condition. Namely, between the time point T1 and the time point T2, the value of the amount of interruption is smaller than the amount of interruption Pb in the normal condition.

Thus, by comparing the acquired data and the reference data by the judgment unit, whether or not deformation occurs in the fork 3A (3B) can be judged. To be specific, when the difference between the amount of interruption during the time period between the point of time t1 and the point of time t2 and the reference value is not more than a predetermined threshold value, the fork 3A (3B) is judged not to have deformation. On the other hand, if the difference exceeds the threshold value, the fork 3A (3B) is judged to have deformation. The threshold value may be determined based on the reference data. For example, the threshold value can be set based on the amount of interruption Pb in the normal condition as a reference. For example, the threshold value can be set within ±5% of the amount of interruption Pb in the normal condition.

Also in the second embodiment, after deformation of the fork 3A has been inspected, the fork 3A is moved backward, and the transport base 31 is moved to the inspection position for inspecting the fork 3B. Then, inspection of the fork 3B is performed. According to the second embodiment, deformation of the forks 3A and 3B in the right and left direction can be reliably and easily detected.

Figure 19:
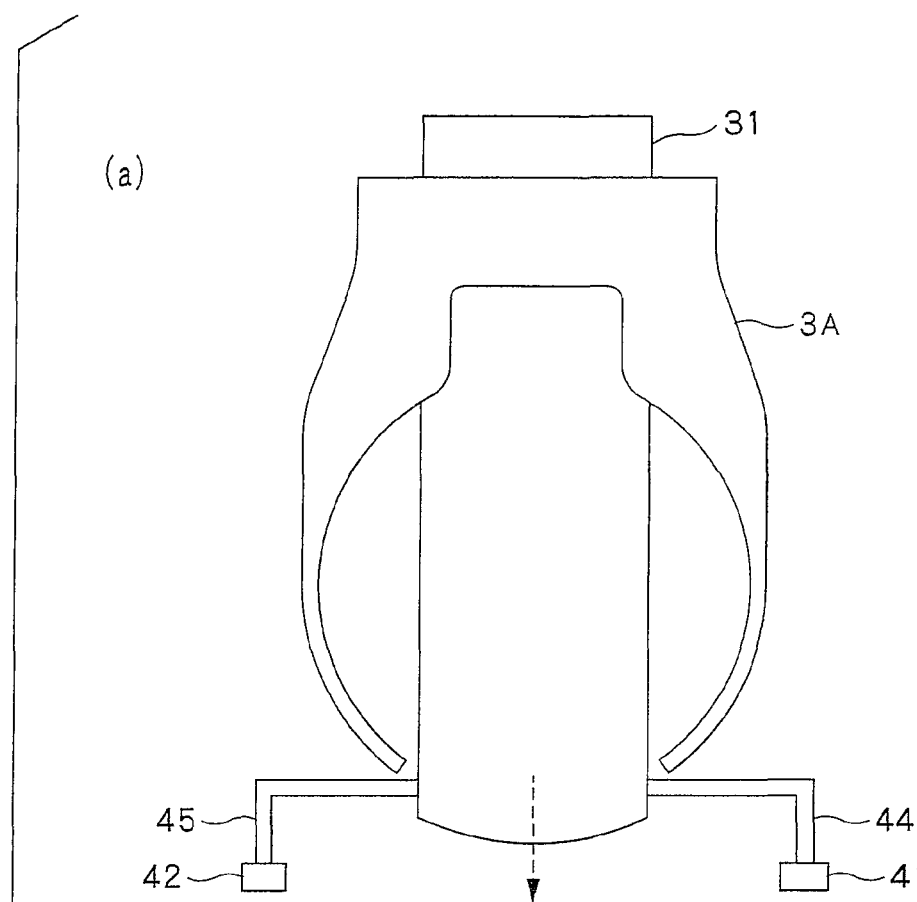
FIG. 19 shows a top plan view and a side view, of the substrate transport apparatus and the optical detection unit in another embodiment.
Figure 19:
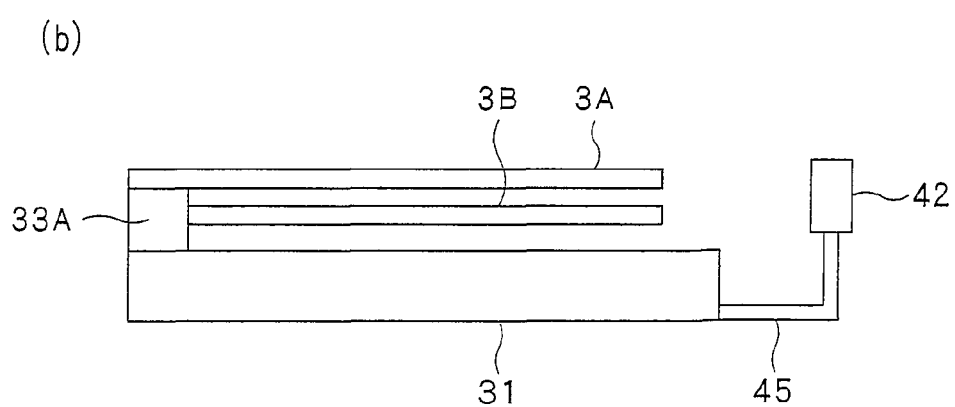

In another embodiment, as shown in FIG. 19, the line sensor 4 (or line sensor 6) may be provided on the transport base 31. FIG. 19 shows a structure in which the transport base is provided with the line sensor 4 configured to detect vertical positions of the forks 3A and 3B. The light emitting device 41 and the light receiving device 42 of the line sensor 4 are attached to the transport base 31 via support members 44 and 45, such that the light emitting device 41 and the light receiving device 42 are located laterally to the moving area of the fork 3A, 3B. A vertical width of the line path 40 is set such that both of the forks 3A and 3B moving forward can interrupt the line path 40. It is possible to simultaneously move the forks 3A and 3B so as to inspect whether or not deformation occurs in the forks 3A and 3B.

When the transport base 31 is provided with the line sensor 6 configured to detect a position (displacement) of the fork 3A (3B) in the right and left direction, the line sensor 6 is attached to the transport base 31 via movable support members (not shown). When a substrate is processed, the line sensor 6 is moved to a position where the line sensor 6 does not interfere with the transport operation of the wafer (e.g., a position in the vicinity of the transport base 31). When deformation of the fork 3A (3B) is inspected, the line sensor 6 is moved to a position where the fork 3A (3B) can pass through the light path of the line sensor 6.

According to the above embodiment, similarly to the aforementioned first and second embodiments, whether or not deformation occurs in the fork 3A, 3B can be reliably and easily detected. In addition, since the line sensor 4 or 6 is attached to the transport base 31, inspection of the forks 3A and 3B can be performed without moving the transport base 31 to the inspection position. Thus, a time required for inspection can be reduced.

Figure 20:
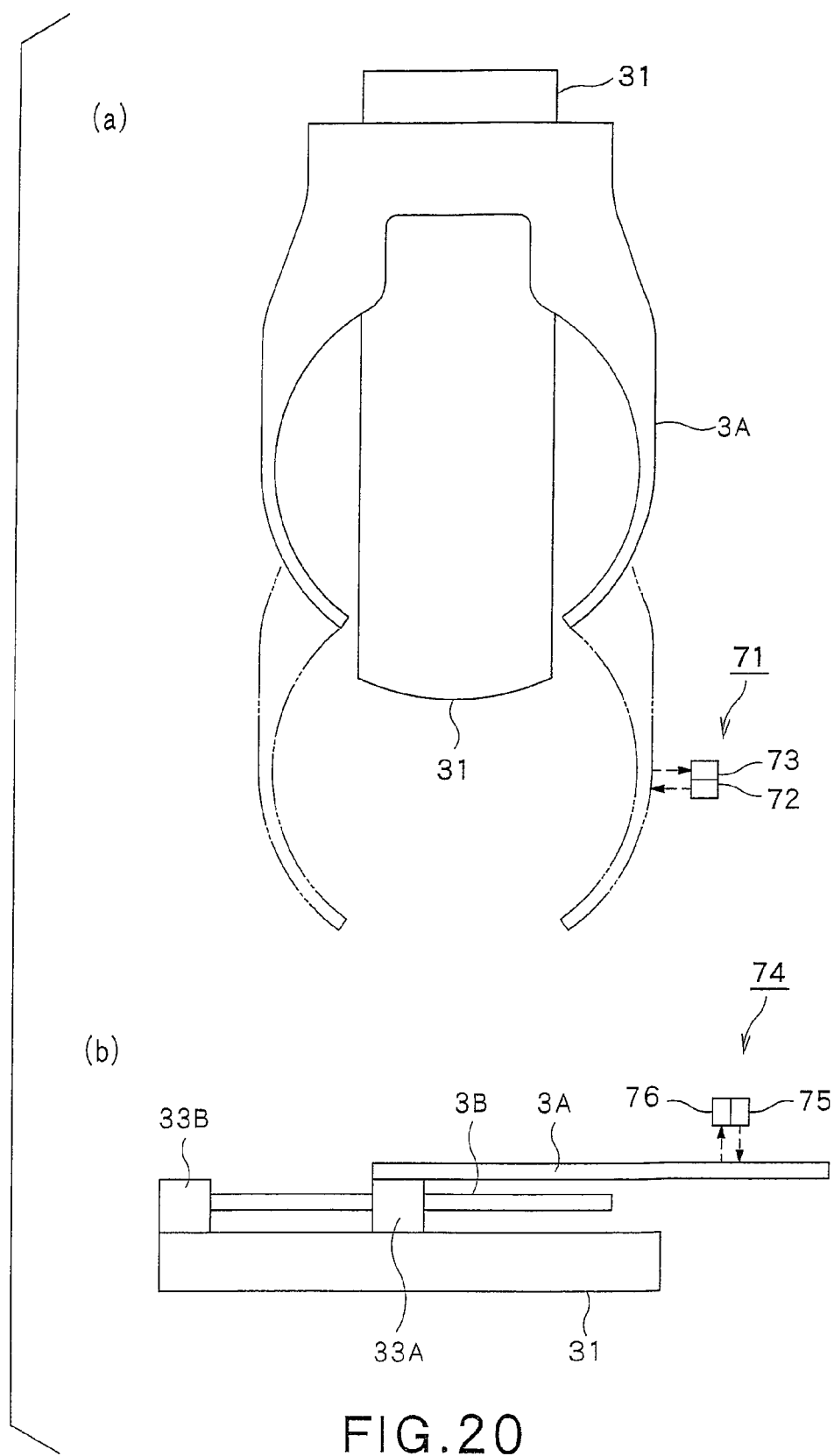
FIG. 20 shows a top plan view and a side view of the substrate transport apparatus and the optical detection unit in yet another embodiment.

Further, a reflection-type optical detection unit 71 may be used as the optical detection unit. In this case, when the vertical position of the fork 3A (3B) is detected, as shown in FIG. 20(a), for example, the optical detection unit 71 is disposed laterally to the moving area of the fork 3A, 3B. The optical detection unit 71 has a light emitting device 72 and a light receiving device 73 which are aligned in the moving direction of the fork 3A (3B). Detection light is emitted from the light emitting device 72 so as to form a light path extending horizontally and having a vertical width. When the fork 3A (3B) passes through a location in front of the optical detection unit 71, light reflected by the side surface of the fork 3A (3B) falls on the light receiving device 73. For example, if the fork 3A (3B) is curved upward or downward with respect to the horizontal plane, an amount of received light lessens. Thus, based on the amount of received light received by the light receiving device 73, the vertical position of the fork 3A, 3B can be detected.

When a reflection-type optical detection unit 74 is used as the optical detection unit configured to detect a position (displacement) of the fork 3A, 3B in the right and left direction, as shown in FIG. 20(b), for example, a light emitting device 75, which forms a light path extending vertically and having a width in the right and left direction, and a light receiving device 76 are disposed above or below the fork 3A, 3B, such that the light emitting device 75 and the light receiving device 76 are aligned in the moving direction of the fork 3A, 3B. When the fork 3A (3B) passes through a location in front of the optical detection unit 74, light reflected by the fork. 3A, 3B falls on the light receiving device 76. For example, if the opening of the distal ends of the fork 3A (3B) is abnormal, an amount of the received light changes. Thus, the position of the fork 3A (3B) in the right and left direction can be detected.

Figure 21:
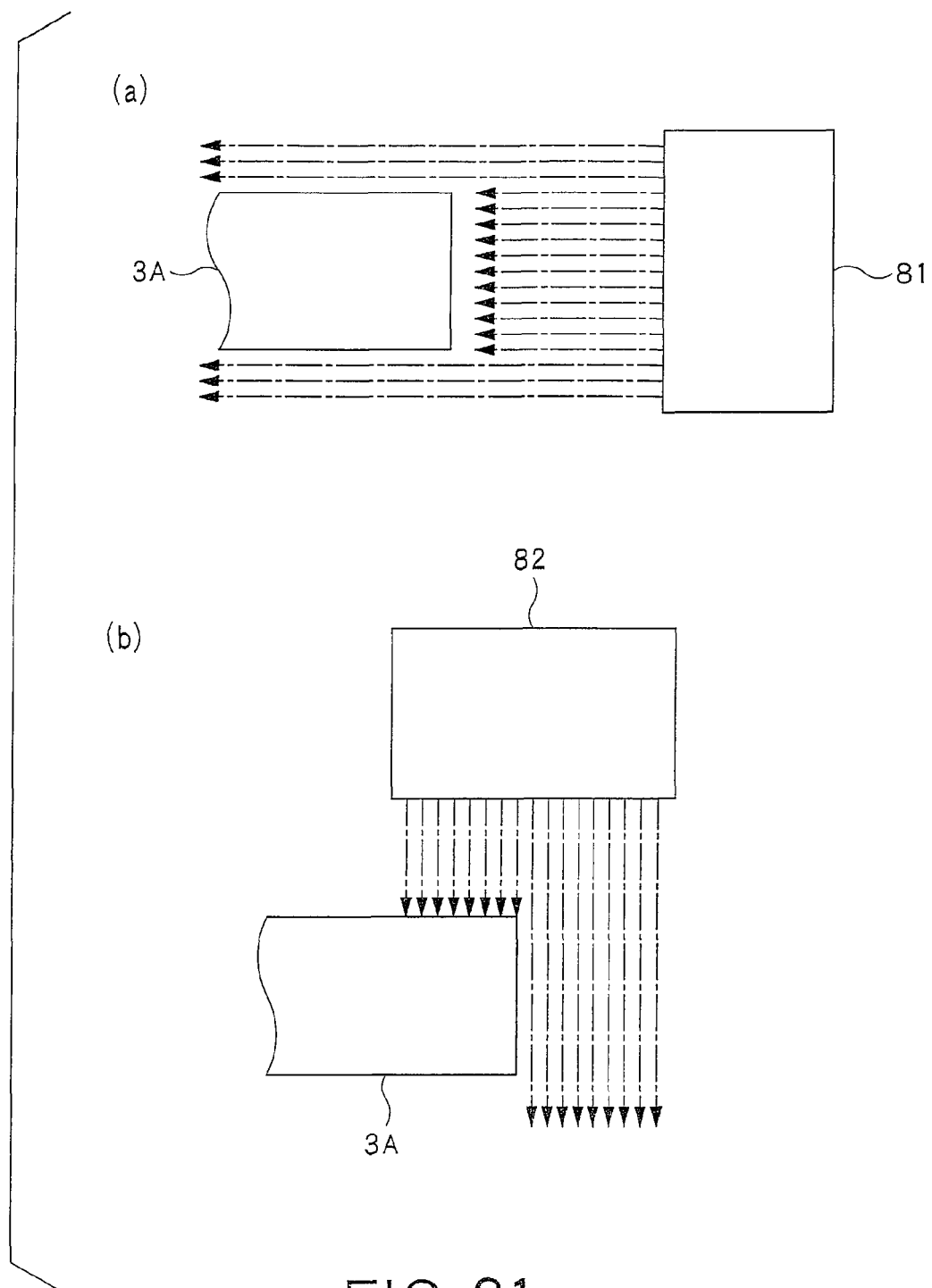
FIG. 21 shows front views each showing a substrate holding member and an, optical detection unit in yet another embodiment.

Furthermore, a distance sensor unit 81 using a laser beam may be used as the optical detection unit. In this case, when a vertical position of the fork 3A (3B) is detected, as shown in FIG. 21(a), for example, the distance sensor unit 81 is disposed laterally to the moving area of the fork 3A (3B). The distance sensor unit 81 is composed of a plurality of sensor elements (not shown) vertically arranged in multiple stages, and is configured to output laser beams from the respective distance sensor elements. When the fork 3A (3B) passes in front of the distance sensor unit 81, laser beams are reflected by the side surface of the fork 3A (3B), and the distance between each distance sensor element and the fork 3A (3B) is measured. Thus, as shown in FIG. 21(a), when the fork 3A (3B) is not deformed, the distances, which are measured by the predetermined distance sensor elements among the number of distance sensor elements, are substantially identical to each other. On the other hand, when the fork 3A (3B) is curved upward or downward with respect to the horizontal plane, the distances, which are measured by the predetermined distance sensor elements, differ from each other. Thus, based on the difference in the measured distances, the vertical position of the fork 3A (3B) can be detected.

In addition, when the position of the fork 3A (3B) in the right and left direction is detected, as shown in FIG. 21(b), for example, a distance sensor unit 82 is disposed above or below the fork 3A (3B). The distance sensor unit 82 is composed of a number of distance sensor elements, which are arranged in a direction perpendicular to the moving direction of the fork 3A (3B) and each of which is configured to vertically emit laser beams. When the fork 3A (3B) passes in front of the distance sensor unit 82, the distance between the distance sensor unit 82 and the fork 3A (3B) is measured based on the laser beams reflected by the fork 3A (3B). The distances measured by the distance sensor elements differ from each other depending on a case where the fork 3A (3B) is detected or not. Thus, based on the difference in the distances, the position of the fork 3A (3B) in the right and left direction can be detected.

A CCD camera may be used as the optical detection unit. In this case, when the fork 3A (3B) is moved forward with respect to the optical detection unit, the vertical position of the fork 3A (3B) or the position thereof in the right and left direction can be detected, by optically photographing the fork 3A (3B).

It is possible to acquire at least one of the vertical position of the substrate holding member and the position thereof in the right and left direction, while the substrate holding member is moved backward with respect to the optical detection unit. It is not necessary to keep constant a speed at which the substrate holding member is moved forward and backward with respect to the optical detection unit. The speed may be varied in the course of movement. When the speed of the substrate holding member is varied, the position of the holding member in the forward and backward direction is acquired from pulse values of the encoder E (see FIG. 2).

The inspection device may be provided with another judgment unit configured to calculate, based on the data expressing the relationship between the vertical position of the substrate holding member and the position thereof in the forward and backward direction, which are acquired by the data acquiring unit, a value of the first order derivative (derived by differentiating the vertical position once with respect to the position in the forward and backward direction); and configure to judge, when the value exceeds a threshold value, that the posture (inclination) of the holding member is abnormal.

The inspection device may be further provided with a display unit configured to display at least one of a graph expressing the relationship between the vertical position of the substrate holding member and the position thereof in the forward and backward direction, and a graph expressing the relationship between the position of the substrate holding member in the right and left direction and the position thereof in the forward and backward direction, based on the data acquired by the data acquiring unit. In this case, the operator may judge whether or not deformation occurs in the substrate holding member, by visually checking the shape of the graph displayed on the display unit. In this case, it is easy to specify the position of the deformed portion, whereby the maintenance can be facilitated.

The inspection device may be provided only one of the optical detection unit for detecting the vertical position of the substrate holding member and the optical detection unit for detecting the position of the substrate holding member in the right and left direction, or alternatively, may be provided with both of the optical detection units.

The inspection device may be provided with another judgment unit configured to calculate, based on the data expressing the relationship between the position of the substrate holding member in the right and left direction and the position thereof in the forward and backward direction, which are acquired by the data acquiring unit, a value of the first order derivative (derived by differentiating the position in the right and left direction once with respect to the position in the forward and backward direction); and configure to judge, when the value exceeds a threshold value, that the posture of the holding member is abnormal.

The inspection of deformation of the substrate holding member may be periodically performed, or may be performed after a maintenance operation in order that whether or not deformation occurs in the substrate holding member is confirmed. Due to the deformation inspection, the height position of the holding member can be also confirmed.

The aforementioned embodiments can, be applied to any given substrate processing system including a substrate processing unit configured to process a substrate, and a substrate transport apparatus configured to transport a substrate to and from the substrate processing unit.

The invention claimed is:

1. An inspection device for inspecting deformation of a substrate holder of a substrate transport apparatus, the substrate transport apparatus having a transport base and a drive unit for horizontally moving the substrate holder in a forward-and-backward direction relative to the transport base, said inspection device comprising:
   an optical detection unit having a light emitter and a light receiver, the optical detection unit being configured to emit by the light emitter a detection light to the substrate holder, configured to receive by the light receiver the detection light affected by the substrate holder thereby to output a detection signal that varies depending on a change of a position of the substrate holder with respect to a direction transverse to the forward-and-backward direction, the optical detection unit being disposed at a location that allows the substrate holder to pass across a light path of the detection light emitted from the light emitter by moving the substrate holder in the forward-and-backward direction; and
   a data acquiring unit configured to acquire correlation data based on the detection signal obtained when the substrate holder is moving in the forward-and-backward direction to pass across the light path of the detection light emitted from the light emitter, the correlation data expressing a relationship between a first parameter indicative of a change of a position of the substrate holder with respect to the forward-and-backward direction and a second parameter indicative of the change of the position of the substrate holder with respect to the direction transverse to the forward-and-backward direction, whereby whether or not deformation occurs in the substrate holder can be judged based on the correlation data.

2. The inspection device according to claim 1, wherein the optical detection unit is provided to detect a vertical position of the substrate holder, and thus the data acquiring unit is configured to acquire correlation data of a relationship between the first parameter, and the second parameter indicative of the change of the vertical position of the substrate holder,
   said inspection device further comprising a judgment unit configured to calculate a value of a second order derivative of a function, which expresses vertical position of the substrate holder as the function of the first parameter, and configured to judge whether or not deformation occurs in the substrate holder based on the calculated value of a second order derivative.

3. The inspection device according to claim 2, wherein the optical detection unit is configured to form the light path of the detection light extending in a right-and-left direction and having a vertical width, and is configured to detect the vertical position of the substrate holder based on an amount of the detection light interrupted by the substrate holder passing across the light path.

4. The inspection device according to claim 3, further comprising a data display unit configured to make a graph expressing the relationship between the first parameter and the second parameter based on the correlation data, and display the graph.

5. The inspection device according to claim 2, further comprising a data display unit configured to make a graph expressing the relationship between the first parameter and the second parameter based on the correlation data, and display the graph.

6. The inspection device according to claim 1, wherein the optical detection unit is configured to form the light path of the detection light extending in a right-and-left direction that is transverse to the forward and backward direction and having a vertical width, and is configured to detect the vertical position of the substrate holder based on an amount of the detection light interrupted by the substrate holder passing across the light path.

7. The inspection device according to claim 6, further comprising a data display unit configured to make a graph expressing the relationship between the first parameter and the second parameter based on the correlation data, and display the graph.

8. The inspection device according to claim 1, wherein:
the substrate holder to be inspected has a bifurcated frame having distal ends configured to surround a periphery of a substrate when the substrate holder holds the substrate; and
the optical detection unit is provided to detect the position of the substrate holder with respect to a right-and-left direction, and thus the data acquiring unit is configured to acquire correlation data of a relationship between the first parameter, and the second parameter indicative of the change of the position of the substrate holder with respect to the right-and-left direction, whereby whether or not deformation relating to a change of an opening degree of the distal ends occurs in the bifurcated frame of the substrate holder can be judged based on the correlation data.

9. The inspection device according to claim 8, wherein the optical detection unit is configured to form the light path of the detection light extending in a vertical direction and having a width with respect to the right-and-left direction, and is configured to detect the position of the substrate holder with respect to the right-and-left direction based on an amount of the detection light interrupted by the substrate holder passing across the light path.

10. The inspection device according to claim 9, further comprising a data display unit configured to make a graph expressing the relationship between the first parameter and the second parameter based on the correlation data, and display the graph.

11. The inspection device according to claim 8, further comprising a data display unit configured to make a graph expressing the relationship between the first parameter and the second parameter based on the correlation data, and display the graph.

12. The inspection device according to claim 1, wherein the optical detection unit is configured to form the light path of the detection light extending in a vertical direction and having a width with respect to a right-and-left direction, and is configured to detect the position of the substrate holder with respect to the right-and-left direction based on an amount of the detection light interrupted by the substrate holder passing across the light path.

13. The inspection device according to claim 12, further comprising a data display unit configured to make a graph expressing the relationship between the first parameter and the second parameter based on the correlation data, and display the graph.

14. The inspection device according to claim 1, further comprising a data display unit configured to make a graph expressing the relationship between the first parameter and the second parameter based on the correlation data, and display the graph.

15. A substrate processing apparatus comprising:
a substrate processing unit configured to perform a treatment to a substrate;
a substrate transport apparatus configured to transfer a substrate to and from the substrate processing unit, the substrate transport apparatus having a transport base, a substrate holder for holding a substrate, and a drive unit for horizontally moving the substrate holder in a forward-and-backward direction relative to the transport base; and
the inspection device according to claim 1.

16. An inspection method for inspecting deformation of a substrate holder of a substrate transport apparatus, the substrate transport apparatus having a transport base and a drive unit for horizontally moving the substrate holder in a forward-and-backward direction relative to the transport base, said inspection method comprising:
moving the substrate holder in the forward-and-backward direction relative to the transport base to pass across a light path of the detection light formed by an optical detection unit;
detecting a position, with respect to a direction transverse to the forward-and-backward direction, of the substrate holder based on a detection signal of the optical detection unit;
making correlation data expressing a relationship between a first parameter indicative of a change of a position of the substrate holder with respect to the forward-and-backward direction and a second parameter indicative of the change of the position of the substrate holder with respect to the direction transverse to the forward-and-backward direction;
judging whether or not deformation occurs in the substrate holder based on the correlation data.

17. The inspection method according to claim 16, wherein:
in the detecting of the position of the substrate holder, a vertical position of the substrate holder is detected; and
the second parameter of the correlation data is the vertical displacement of the substrate holder;
said inspection method further comprising:
calculating a value of a second order derivative of a function, which expresses vertical position of the substrate holder as the function of the first parameter; and
judging whether or not deformation occurs in the substrate holder based on the calculated value of a second order derivative.

18. The inspection method according to claim 17, wherein:
the light path of the optical detection unit extends in a right-and-left direction and has a vertical width, and a vertical position of the substrate holder is determined based on an amount of interruption of the detection light by the substrate holder.

19. The inspection method according to claim 16, wherein:
the light path of the optical detection unit extends in a right-and-left direction and has a vertical width, and a vertical position of the substrate holder is determined based on an amount of interruption of the detection light by the substrate holder.

20. A non-transitory storage medium storing a computer program, wherein upon execution of the program by a computer, the computer controls a substrate transport apparatus having a substrate holder for holding a substrate, a transport base and a drive unit for horizontally moving the substrate holder in a forward-and-backward direction relative to the base member, and the control computer also controls a substrate inspection device having an optical detection unit, to perform the inspection method according to claim 16.

* * * * *